(12) United States Patent
Kim

(10) Patent No.: US 10,347,688 B2
(45) Date of Patent: Jul. 9, 2019

(54) IMAGE SENSOR INCLUDING PHOTODIODES HAVING DIFFERENT SIZES AND ARE ISOLATED BY AN ISOLATION REGION

(71) Applicant: SK hynix Inc., Gyeonggi-do (KR)

(72) Inventor: Sung-Man Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 180 days.

(21) Appl. No.: 15/636,780

(22) Filed: Jun. 29, 2017

(65) Prior Publication Data

US 2018/0158864 A1 Jun. 7, 2018

(30) Foreign Application Priority Data

Dec. 7, 2016 (KR) .................. 10-2016-0165651

(51) Int. Cl.
| | | |
|---|---|---|
| H01L 27/146 | (2006.01) |
| H01L 27/148 | (2006.01) |
| H04N 5/3745 | (2011.01) |
| H01L 21/8238 | (2006.01) |
| H04N 9/04 | (2006.01) |
| H04N 5/378 | (2011.01) |

(52) U.S. Cl.
CPC .... *H01L 27/14831* (2013.01); *H01L 21/8238* (2013.01); *H01L 27/14609* (2013.01); *H01L 27/14685* (2013.01); *H04N 5/378* (2013.01); *H04N 5/3745* (2013.01); *H04N 9/045* (2013.01)

(58) Field of Classification Search
CPC .......... H01L 27/14831; H01L 27/1463; H01L 21/8238; H01L 27/14603; H01L 27/14645; H04N 9/045; H04N 5/378
USPC .................... 250/208.1, 239, 214 R
See application file for complete search history.

(56) References Cited

U.S. PATENT DOCUMENTS

| | | | |
|---|---|---|---|
| 9,219,871 B2 | 12/2015 | Hamada | |
| 9,825,077 B2 * | 11/2017 | Watanabe | ......... H01L 27/14609 |
| 2015/0312461 A1 | 10/2015 | Kim et al. | |

* cited by examiner

Primary Examiner — Que Tan Le
(74) Attorney, Agent, or Firm — IP & T Group LLP

(57) ABSTRACT

Disclosed is an image sensor may include a pixel array having a central region and peripheral regions around the central region, one or more first unit pixels arranged in the peripheral regions. Each of the first unit pixels comprising a pair of left and right photodiodes. The left and right photodiodes in at least one of the one or more of the first unit pixels may have different sizes and are optically isolated from each other by a first PD isolation region.

20 Claims, 31 Drawing Sheets

| 13a1 | 13a2 | 13a3 | 12a1 | 13b1 | 13b2 | 13b3 |
|------|------|------|------|------|------|------|
| 13a4 | 13a5 | 13a6 | 12a2 | 13b4 | 13b5 | 13b6 |
| 13a7 | 13a8 | 13a9 | 12a3 | 13b7 | 13b8 | 13b9 |
| 12c1 | 12c2 | 12c3 | 11 | 12d1 | 12d2 | 12d3 |
| 13c1 | 13c2 | 13c3 | 12b1 | 13d1 | 13d2 | 13d3 |
| 13c4 | 13c5 | 13c6 | 12b2 | 13d4 | 13d5 | 13d6 |
| 13c7 | 13c8 | 13c9 | 12b3 | 13d7 | 13d8 | 13d9 |

IMAGE SENSOR INCLUDING PHOTODIODES HAVING DIFFERENT SIZES AND ARE ISOLATED BY AN ISOLATION REGION

CROSS-REFERENCE TO RELATED APPLICATIONS

The present application claims priority to Korean Patent Application No. 10-2016-0165651, filed on Dec. 7, 2016, which is herein incorporated by reference in its entirety.

BACKGROUND

1. Field

Exemplary embodiments of the present invention relate to an image sensor, and more particularly, to an image sensor including photodiodes of different sizes.

2. Description of the Related Art

Recently, with the development of the information communication industries and the digitalization of electronic devices, enhanced image sensors have been used in various products spanning diverse fields such as digital cameras, camcorders, mobile phones, PCS (Personal Communication System), game machines, security cameras, and medical micro-cameras. In general, an image sensor includes a pixel region including photodiodes and a peripheral circuit region. A unit pixel includes a photodiode and a transmission transistor. The transmission transistor is disposed between the photodiode and a floating diffusion region to transmit a charge generated by the photodiode to the floating diffusion region.

In an image sensor installed in a module, light transmitted through a module lens is incident on pixels of the image sensor at various slope angles. In particular, since light is obliquely incident on pixels positioned at the edges of a pixel array of the image sensor at large slope angles, an intensity of light transmitted to the pixels at the edges of the pixel array decreases non-linearly.

SUMMARY

Various embodiments of the present invention are directed to an image sensor including photodiodes of different sizes.

Also, various embodiments are directed to an image sensor including left and right photodiodes isolated by a trench isolation region.

Also, various embodiments are directed to an image sensor including a plurality of regions having adjoining photodiodes of different sizes.

An image sensor in accordance with an embodiment of the present invention may include a pixel array having a central region and peripheral regions around the central region, one or more first unit pixels arranged in the peripheral regions, each of the first unit pixels comprising a pair of left and right photodiodes. The left and right photodiodes in at least one of the one or more of the first unit pixels may have different sizes and may be optically isolated from each other by a first PD isolation region.

The peripheral regions may include a left-side edge region adjacent to a left side of the central region, and in the left-side edge region, the left photodiode has a larger size than the right photodiode.

The peripheral regions may include a right-side edge region adjacent to a right side of the central region, and in the right-side edge region. The right photodiode may have a larger size than the left photodiode.

The peripheral regions may include a top-side edge region adjacent to a top side of the central region and a bottom-side edge region adjacent to a bottom side of the central region, and in the top-side edge region and the bottom-side edge region. The left photodiode and the right photodiode may have the same size.

The peripheral regions may further include corner regions arranged adjacent to corners of the central region, and one or more second unit pixels arranged in the corner regions. Each of the second unit pixels may comprise a pair of first and second photodiodes which are isolated from each other by a second PD isolation region. The second PD isolation region may be extended in a diagonal direction perpendicular to a diagonal line passing through the center of the pixel array.

The first and second photodiodes in the corner regions may have the same size.

The corner regions may include a left-top corner region adjacent to the left-top corner of the central region and a right-bottom corner region adjacent to the right-bottom corner of the central region. One or more of the unit pixels in the left-top corner region and the right-bottom corner region may include a left-top photodiode and a right-bottom photodiode The corner regions may include a right-top corner region adjacent to the right-top corner of the central region and a left-bottom corner region adjacent to the left-bottom corner of the central region. One or more of the unit pixels in the right-top corner region and the left-bottom corner region may include a left-bottom photodiode and a right-top photodiode The first PD isolation region may include a DTI (Deep Trench Isolation) region.

The peripheral regions may include edge regions and corner regions. The pixel array may be divided into the central region and the edge regions in a range of 50% to 80% of the entire length from the center of the pixel array to the outermost sides of the pixel array in horizontal and vertical directions.

The image sensor may further include grid patterns defining the first unit pixels.

Parts of the grid patterns partly may overlap with the left photodiodes or the right photodiodes.

The pair of the left photodiode and the right photodiode may share the same color filter.

An image sensor in accordance with an embodiment of the present invention may include a pixel array having a central region and corner regions adjacent to corners of the central region, one or more first unit pixels are arranged in the corner regions. Each of the first unit pixels may include a pair of left and right photodiodes which are isolated from each other in a diagonal direction by a PD isolation region.

The corner regions may include a left-top corner region adjacent to the left-top corner of the central region and a right-bottom corner region adjacent to the right-bottom corner of the central region. The PD isolation regions in the left-top corner region and the right-bottom corner region may be extended in a direction from a right top to a left bottom of the pixel array.

The corner regions may include a right-top corner region adjacent to the right-top corner of the central region and a left-bottom corner region adjacent to the left-bottom corner of the central region. The PD isolation regions in the right-top corner region and the left-bottom corner region may be extended in a direction from a left top to a right bottom of the pixel array.

The left photodiode and the right photodiode may have the same size in a triangular shape.

The pixel array may further include a left-side edge region adjacent to a left side of the central region and a right-side edge region adjacent to a right side of the central region, and one or more second unit pixels arranged in the left-side edge region. Each of the second unit pixels comprising a left photodiode having a relatively large size and a right photodiode having a relatively small size. One or more third unit pixels may be arranged in the right-side edge region. Each of the third unit pixels may include a right photodiode having a relatively large size and a left photodiode having a relatively small size.

The pixel array may further include a top-side edge region adjacent to a top side of the central region and a bottom-side edge region adjacent to a bottom side of the central region. One or more fourth unit pixels may be arranged in the top-side edge region and the bottom-side edge region. Each of the fourth unit pixels may include left and right photodiodes having the same size.

The left photodiodes and the right photodiodes in the left-side edge region, the right-side edge region, the top-side edge region and the bottom-side edge region may be isolated by PD isolation regions extended in a column direction.

An electronic device in accordance with an embodiment of the present invention may include at least one image sensor. The at least one image sensor may include a pixel array having a central region and peripheral regions around the central region, one or more of first unit pixels arranged in the peripheral regions, each of the first unit pixels including a pair of left and right photodiodes. The left and right photodiodes in at least one of the one or more of the first unit pixels may have different sizes and may be optically isolated from each other by a first PD isolation region.

The electronic device may further include an optical system suitable for guiding incident light to a pixel array of the image sensor, a shutter unit suitable for controlling a light irradiation period and a light shielding period for the image sensor, a driver suitable for controlling a transmission operation of the image sensor and a shutter operation of the shutter unit, and a signal processor suitable for processing various types of signals outputted from the image sensor and outputting a processed image signal.

BRIEF DESCRIPTION OF THE DRAWINGS

FIG. 8E is a diagram illustrating that the regions of the pixel array of the image sensor in accordance with an embodiment of the present invention are divided.

DETAILED DESCRIPTION

Figure 1:
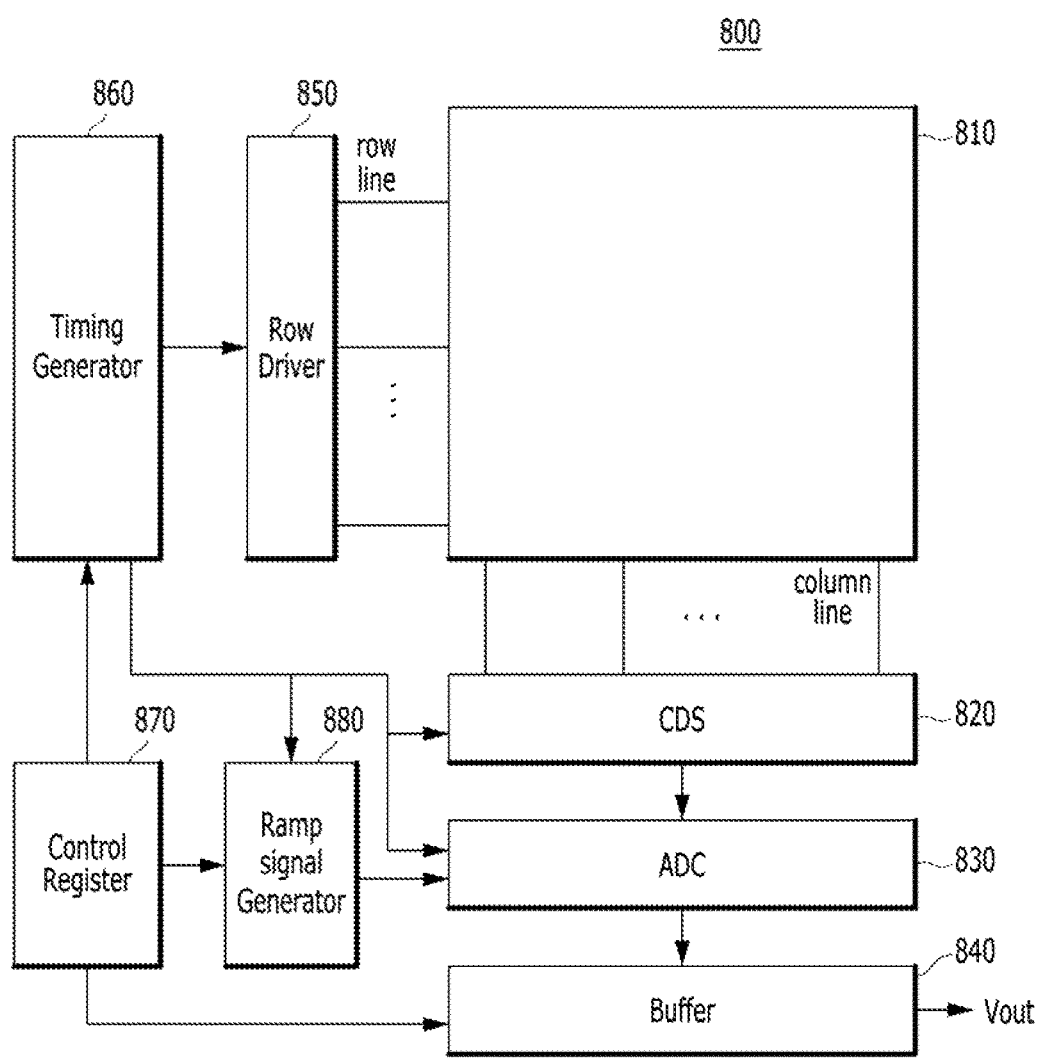
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the inventive concepts to those skilled in the art. Throughout the disclosure, like reference numerals refer to like parts throughout the various figures and embodiments of the present invention.

The terms used in this specification are only used for describing exemplary embodiments, and do not limit the inventive concepts. The meaning of 'comprise' and 'comprising' used in this specification specifies a component, step, operation, and/or element but does not exclude other components, steps, operations, and/or elements.

When one element is referred to as being 'connected to' or 'coupled to' another element, it may indicate that the former element is directly connected or coupled to the latter element or another element is interposed therebetween. On the other hand, when one element is referred to as being 'directly connected to' or 'directly coupled to' another element, it may indicate that no element is interposed therebetween. Furthermore, 'and/or' includes each of described items and combinations thereof.

The terms such as 'below', 'beneath', 'lower', 'above' and 'upper', which are spatially relative terms, may be used to describe the correlation between one element or components and another element or other components as illustrated in the accompanying drawings. The spatially relative terms should be understood as terms including different directions of elements on use or operation, in addition to directions illustrated in the drawings. For example, when an element illustrated in a drawing is turned over, the element which is referred to as being 'below' or 'beneath' another element may be positioned above the another element.

Moreover, embodiments of this specification will be described with reference to cross-sectional views and/or plan views which are ideal exemplary views for the inventive concepts. In the drawings, the thicknesses of layers and regions may be exaggerated for clarity of illustration. Thus, the exemplary views may be modified depending on fabrication techniques and/or allowable errors. Therefore, the present embodiments are not limited to specific shapes illustrated in the drawings, but may include other shapes which are created according to a fabrication process. For example, an angled region may have a rounded shape or a certain curvature. Therefore, regions exemplified in the drawings have rough properties, and the shapes of the regions are used to exemplify specific shapes of element regions. Thus, the shapes of the regions do not limit the scope of the inventive concepts.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

Referring to FIG. 1, the image sensor 800 may include a pixel array 810, a Correlated Double Sampler (CDS) 820, an Analog-to-Digital Converter (ADC) 830, a buffer 840, a row driver 850, a timing generator 860, a control register 870, and a ramp signal generator 880.

The pixel array 810 may include a plurality of pixels arranged in a matrix structure. The plurality of pixels may convert optical image information into an electrical image signal, and transmit the electrical image signal to the CDS 820 through column lines. Each of the pixels may be coupled to one of a plurality of row lines and one of a plurality of column lines.

The CDS 820 may hold and sample the electrical image signal received from the pixels of the pixel array 810. For example, the CDS 820 may sample a reference voltage level and a voltage level of the received electrical image signal based on a clock signal provided from the timing generator 860, and produce an analog signal corresponding to a difference therebetween to transmit to the ADC 830.

The ADC 830 may convert the received analog signal into a digital signal and transmit the digital signal to the buffer 840.

The buffer 840 may latch the digital signal received from the ADC 830 and sequentially output the latched signal to an image signal processor (not illustrated). The buffer 840 may include a memory for latching a digital signal and a sense amplifier for amplifying a digital signal.

The row driver 850 may drive the plurality of pixels in the pixel array 810 according to a timing signal from the timing generator 860. For example, the row driver 850 may generate select signals for selecting one row line among the plurality of row lines and/or driving signals for driving one row line among the plurality of row lines.

The timing generator 860 may generate timing signals for controlling the CDS 820, the ADC 830, the row driver 850 and the ramp signal generator 880.

The control register 870 may generate control signals for controlling the buffer 840, the timing generator 860 and the ramp signal generator 880.

The ramp signal generator 880 may generate a ramp signal for controlling an image signal provided to the buffer 840 from the ADC 830 under the control of the timing generator 860.

Figure 2:
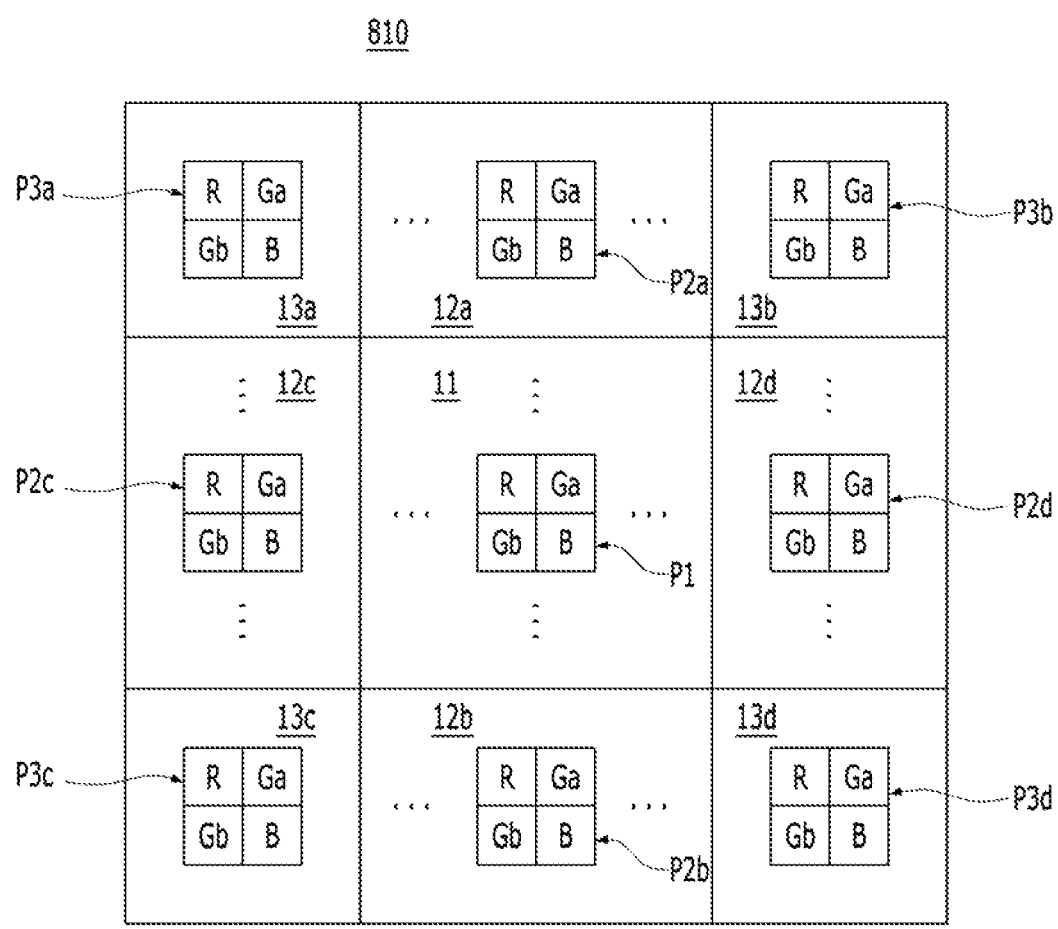
FIG. 2 illustrates a schematic layout of a pixel array of the image sensor in accordance with an embodiment of the present invention.

Referring to FIG. 2, the pixel array 810 of the image sensor 800 in accordance with an embodiment of the present invention may include a central region 11 and peripheral regions 12a to 12d and 13a to 13d. The peripheral regions 12a to 12d and 13a to 13d may include edge regions 12a to 12d and corner regions 13a to 13d. The edge regions 12a to 12d may include a top-side edge region 12a, a bottom-side edge region 12b, a left-side edge region 12c, and a right-side edge region 12d, each of which is adjacent to the respective outermost sides of the pixel array 810. The corner regions 13a to 13d may include a left-top corner region 13a, a right-top corner region 13b, a left-bottom corner region 13c, and a right-bottom corner region 13d, each of which is arranged at the respective corners of the pixel array 810.

The central region 11 may be arranged at a center of the pixel array 810. The edge regions 12a to 12d may be arranged adjacent to a top side, a bottom side, a left side, and a right side of the central region 11, respectively, and the corner regions 13a to 13d may be arranged adjacent to a left-top corner, a right-top corner, a left-bottom corner, and a right-bottom corner of the central region 11, respectively. The regions 11, 12a to 12d, and 13a to 13d may include a plurality of pixels P1, P2a to P2a, and P3a to P3d, respectively. The pixels P1, P2a to P2a, and P3a to P3d may include a central pixel P1, edge pixels P2a to P2d, and corner pixels P3a to P3d. Each of the pixels P1, P2a to P2a, and P3a to P3d may include four unit pixels R, Ga, Gb, and B, for example, a red pixel R, green pixels Ga and Gb, and a blue pixel B.

Figure 3A:
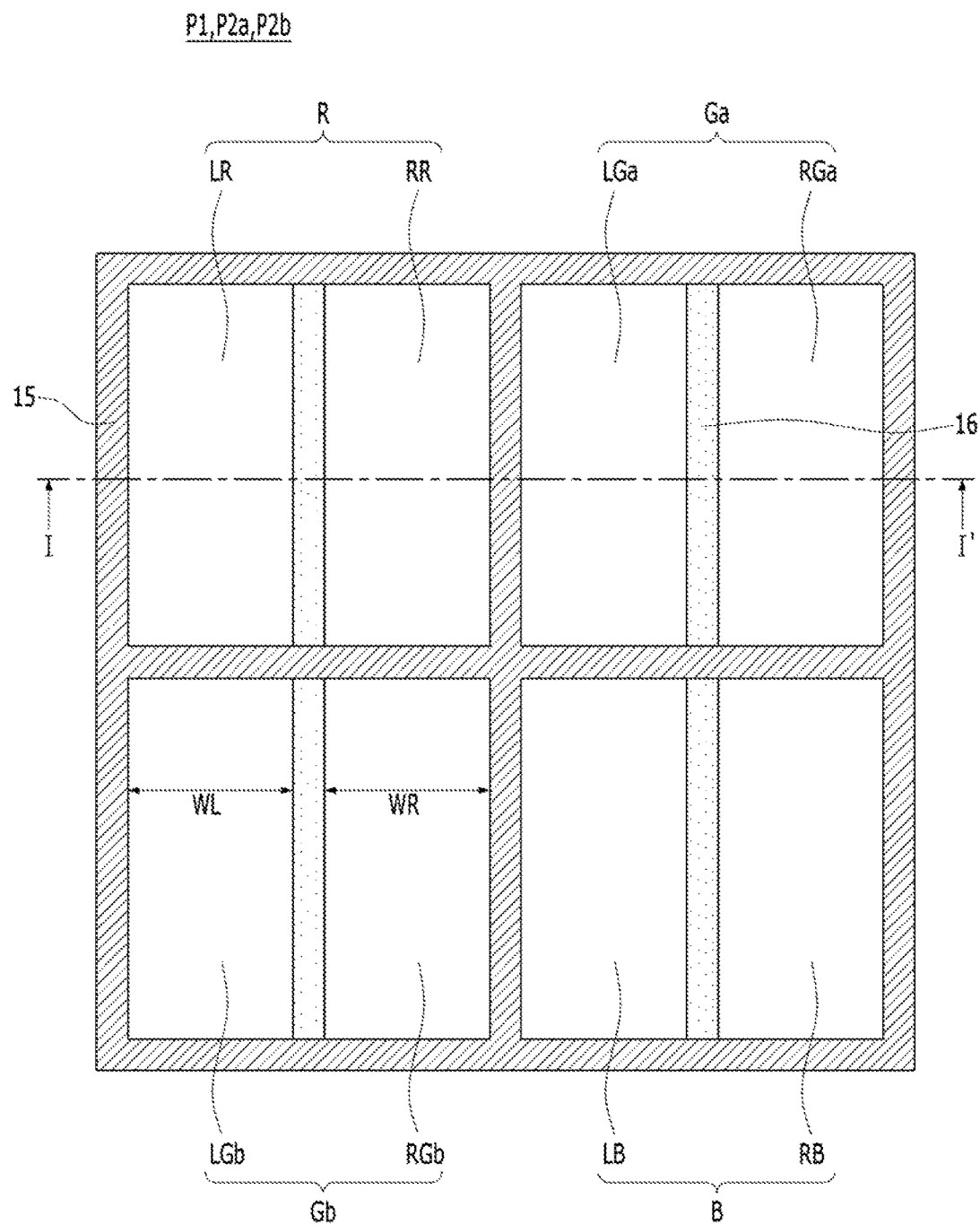
FIGS. 3A to 3E illustrate magnified layouts of pixels in accordance with various embodiments of the present invention.
Figure 3B:
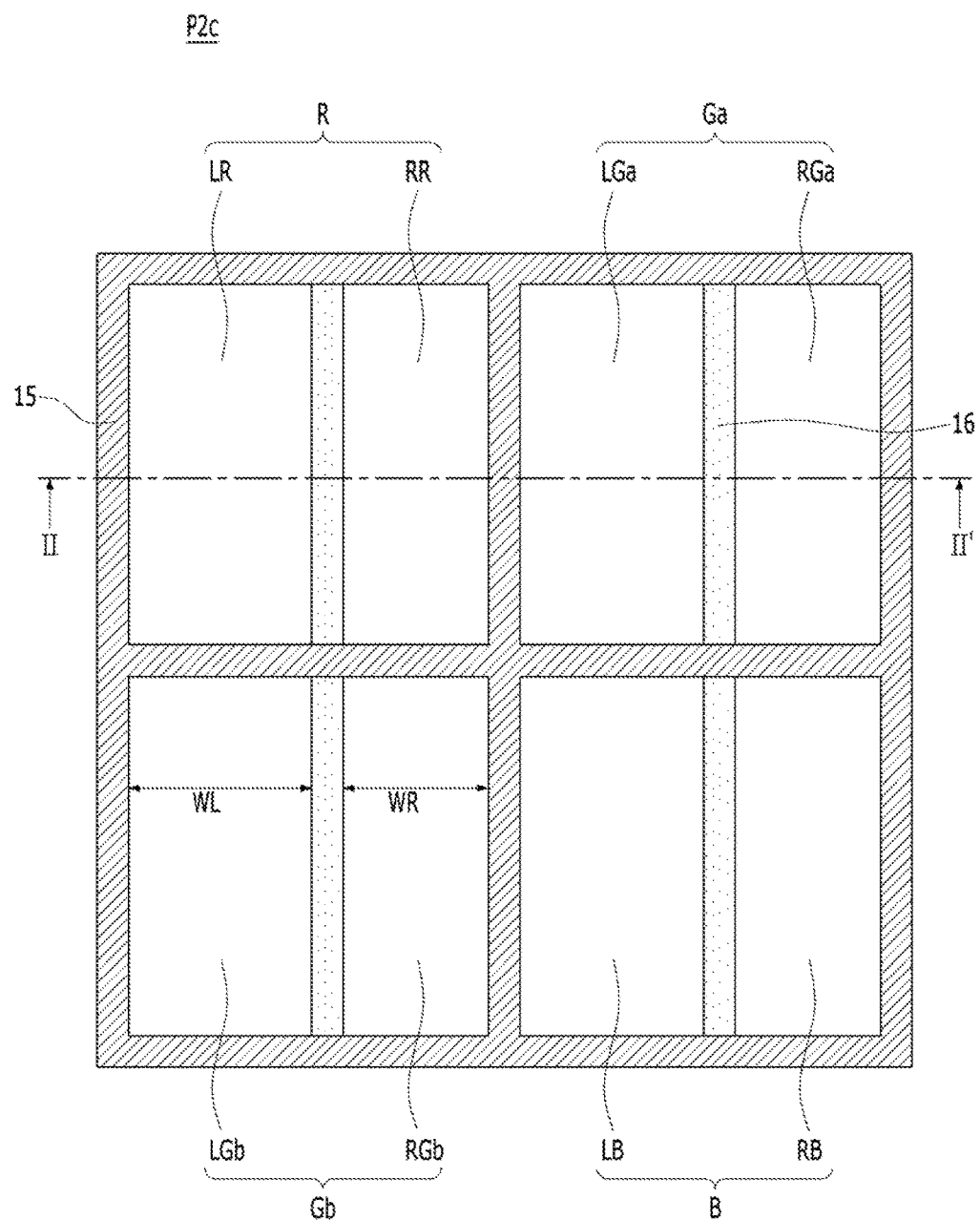
Figure 3C:
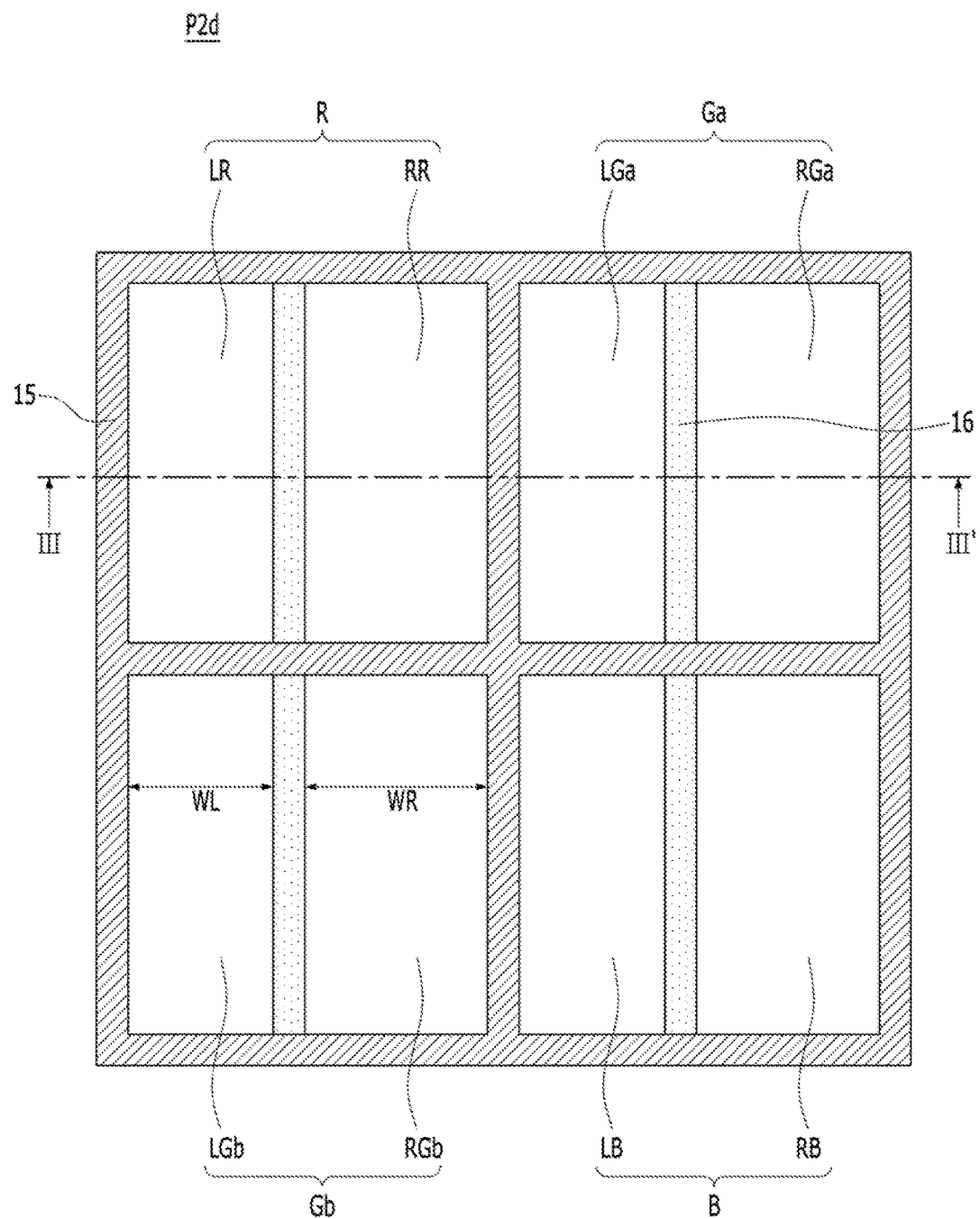
Figure 3D:
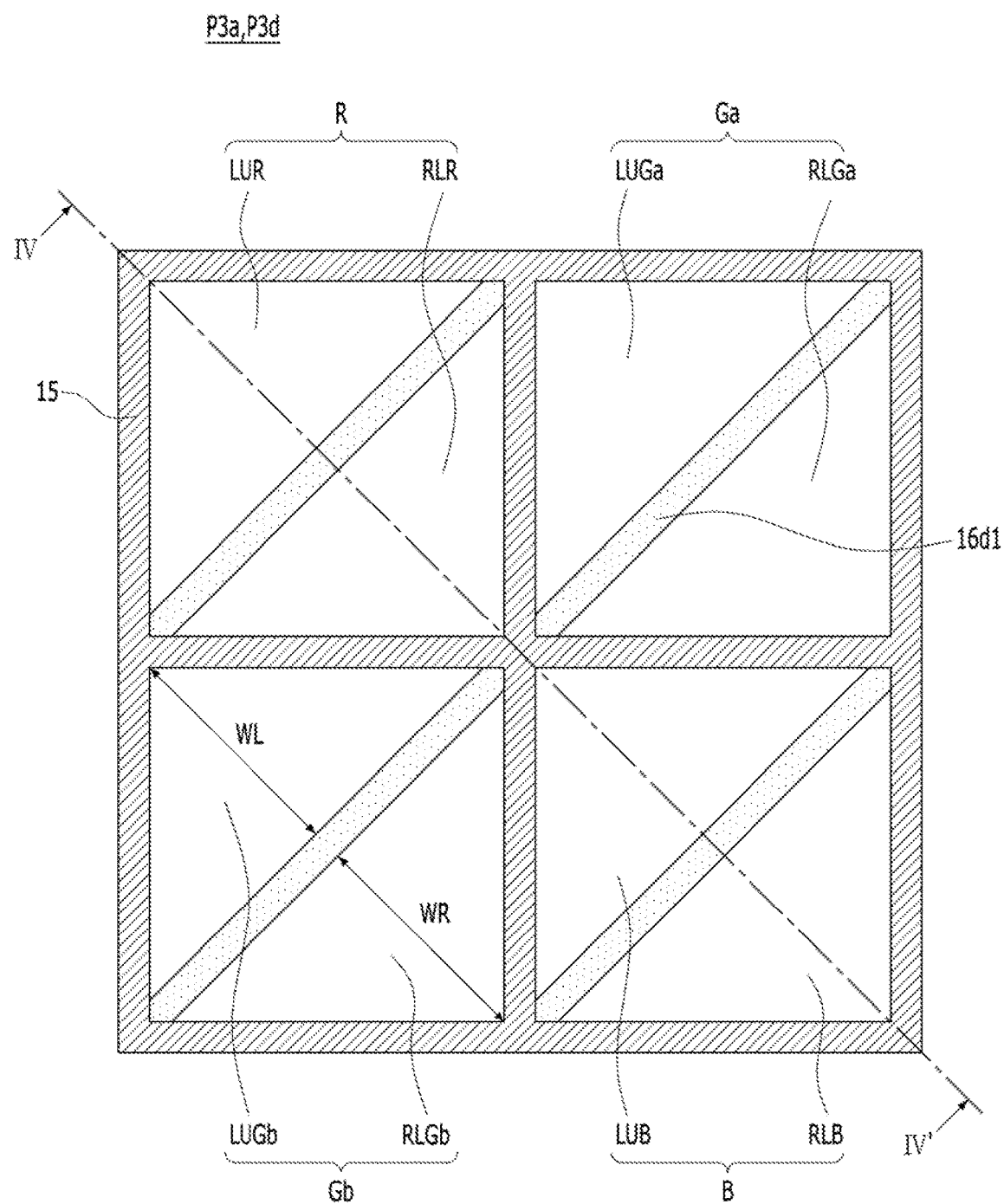
Figure 3E:
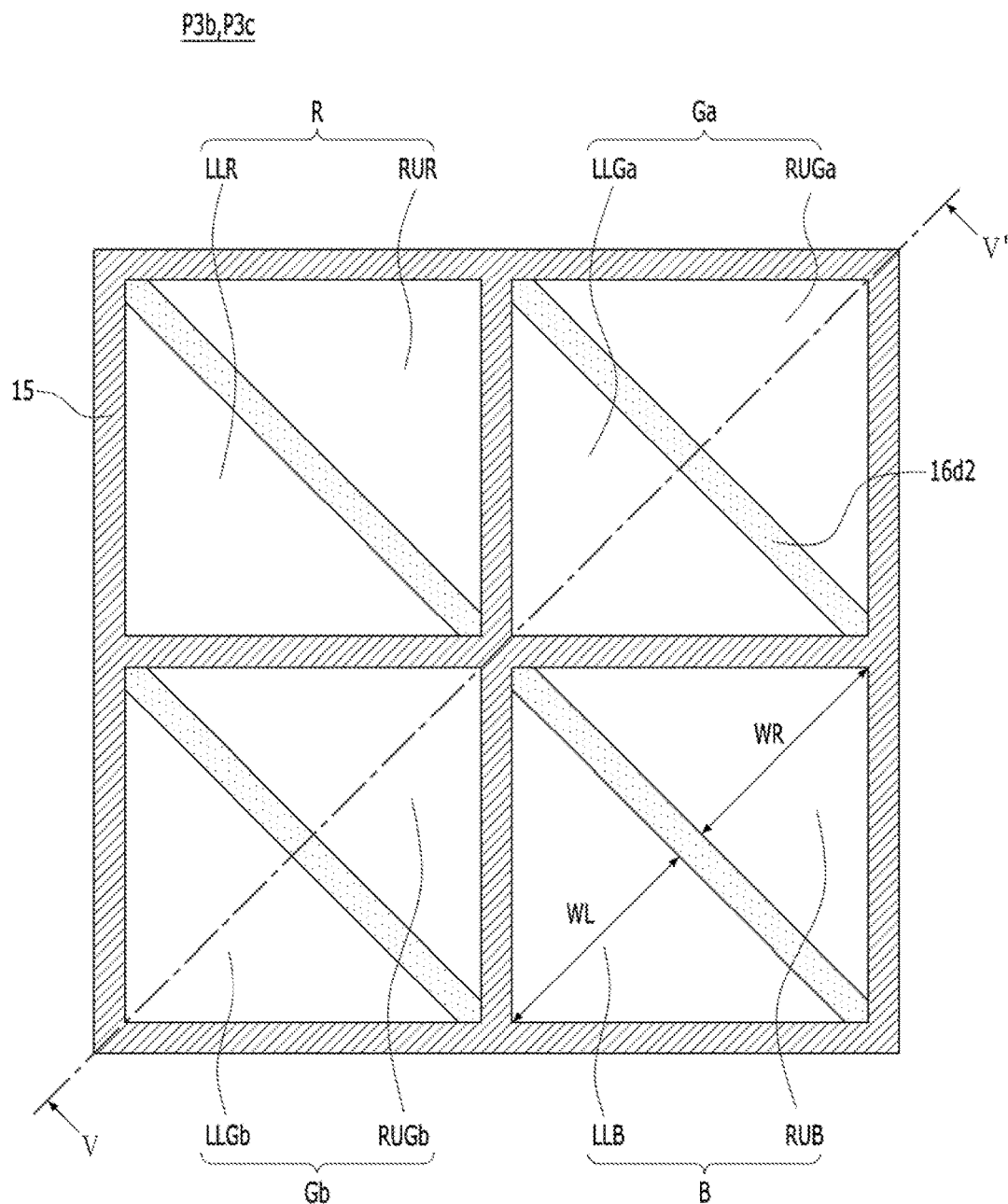

FIG. 3A illustrates a magnified layout of the pixels P1, P2a, and P2b in the central region 11, the top-side edge region 12a, and the bottom-side edge region 12b. FIG. 3B illustrates a magnified layout of the pixel P2c in the left-side edge region 12c. FIG. 3C illustrates a magnified layout of the pixel P2d in the right-side edge region 12d. FIG. 3D illustrates a magnified layout of the pixels P3a and P3d in the left-top corner region 13a and the right-bottom corner region 13d. FIG. 3E illustrates a magnified layout of the pixels P3b and P3c in the right-top corner region 13b and the left-bottom corner region 13c.

Referring to FIGS. 3A to 3E, each of the pixels P1, P2a to P2a, and P3a to P3d may include unit pixels R, Ga, Gb, and B isolated from each other and defined by pixel isolation regions 15. The pixel isolation regions 15 may have a lattice shape defining four unit pixels R, Ga, Gb, and B as four bays.

Referring to FIG. 3A, the unit pixels R, Ga, Gb, and B of the pixel P1 in the central region 11 may have left photodiodes LR, LGa, LGb, and LB and right photodiodes RR, RGa, RGb, and RB, respectively, which are equally isolated by PD isolation regions 16 extending in the column direction. The left photodiodes LR, LGa, LGb, and LB and the right photodiodes RR, RGa, RGb, and RB may have substantially the same size (or same volume). That is, a width WL of the left photodiodes LR, LGa, LGb, and LB may be substantially equal to a width WR of the right photodiodes RR, RGa, RGb, and RB (WL=WR).

Referring to FIGS. 3B and 3C, the unit pixels R, Ga, Gb, and B of the pixels P2c and P2d in the left-side edge region 12c and the right-side edge region 12d may have left photodiodes LR, LGa, LGb, and LB and right photodiodes RR, RGa, RGb, and RB, respectively, which are asymmetrically isolated by PD isolation regions 16 extending in the column direction. Referring to FIG. 3B, the unit pixels R, Ga, Gb, and B of the pixel P2c in the left-side edge region 12c may include the left photodiodes LR, LGa, LGb, and LB having a relatively large size and the right photodiodes RR, RGa, RGb, and RB having a relatively small size, respectively. That is, a width WL of the left photodiodes LR, LGa, LGb, and LB may be larger than a width WR of the right photodiodes RR, RGa, RGb, and RB (WL>WR). Referring to FIG. 3C, the unit pixels R, Ga, Gb, and B of the pixel P2d in the right-side edge region 12d may include the left photodiodes LR, LGa, LGb, and LB having a relatively small size and the right photodiodes RR, RGa, RGb, and RB having a relatively large size, respectively. That is, a width WL of the left photodiodes LR, LGa, LGb, and LB may be smaller than a width WR of the right photodiodes RR, RGa, RGb, and RB (WL<WR).

Referring to FIGS. 3D and 3E, the pixels P3a, P3b, P3c, and P3d in the left-top corner region 13a, the right-top corner region 13b, the left-bottom corner region 13c, and the right-bottom corner region 13d may include left photodiodes LUR, LUGa, LUGb, LUB, LLR, LLGa, LLGb, and LLB and right photodiodes RLR, RLGa, RLGb, RLB, RUR, RUGa, RUGb, and RUB, which are isolated in a triangular shape by PD isolation regions 16d1 and 16d2 extending in a diagonal direction.

Referring to FIG. 3D, the unit pixels R, Ga, Gb, and B of the pixels P3a and P3d in the left-top corner region 13a and the right-bottom corner region 13d may include left-top photodiodes LUR, LUGa, LUGb, and LUB and right-bottom photodiodes RLR, RLGa, RLGb, and RLB, respectively, which are isolated by the PD isolation regions 16d1 extending along a diagonal direction from the right top to the left bottom. The maximum width WL of the left-top photodiodes LUR, LUGa, LUGb, and LUB and the maximum width WR of the right-bottom photodiodes RLR, RLGa, RLGb, and RLB may be substantially equal to each other (WL=WR). The maximum widths WL and WR may be measured along the diagonal direction perpendicular to the PD isolation regions 16d1.

Referring to FIG. 3E, the unit pixels R, Ga, Gb, and B of the pixels P3b and P3c in the right-top corner region 13b and the left-bottom corner region 13c may include left-bottom photodiodes LLR, LLGa, LLGb, and LLB and right-top photodiodes RUR, RUGa, RUGb, and RUB, respectively, which are isolated by the PD isolation regions 16d2 extending along a diagonal direction from the left top to the right bottom. Similarly, the maximum width WL of the left-bottom photodiodes LLR, LLGa, LLGb, and LLB and the maximum width WR of the right-top photodiodes RUR, RUGa, RUGb, and RUB, which are measured along the diagonal direction perpendicular to the PD isolation regions 16d2, may be substantially equal to each other (WL=WR).

In FIGS. 3D and 3E, the PD isolation regions 16d1 and 16d2 may extend in diagonal directions perpendicular to diagonal directions passing through the center of the pixel array 810.

Figure 4A:
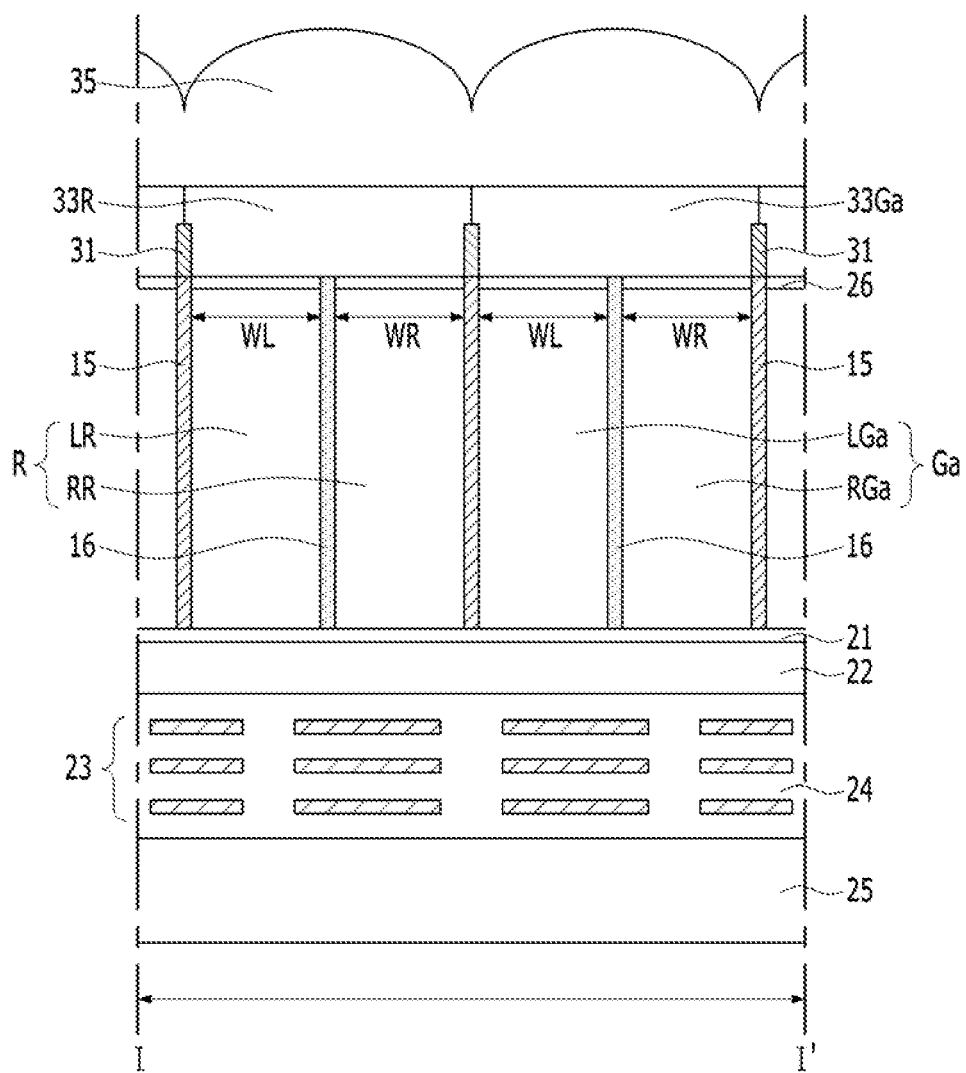
FIGS. 4A to 4E are cross-sectional views of the pixels shown in FIGS. 3A to 3E pixels, taken along I-I' to V-V' lines of FIGS. 3A to 3E, respectively.
Figure 4B:
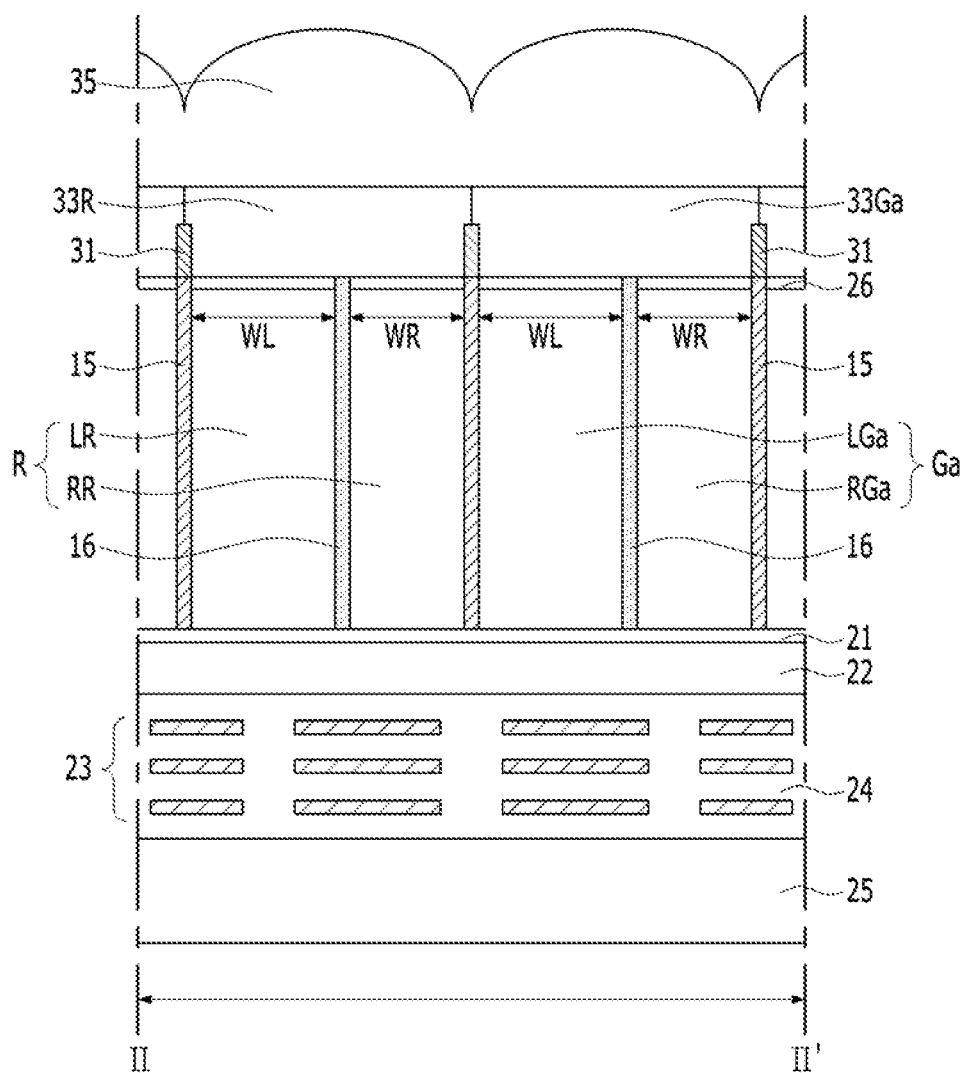
Figure 4C:
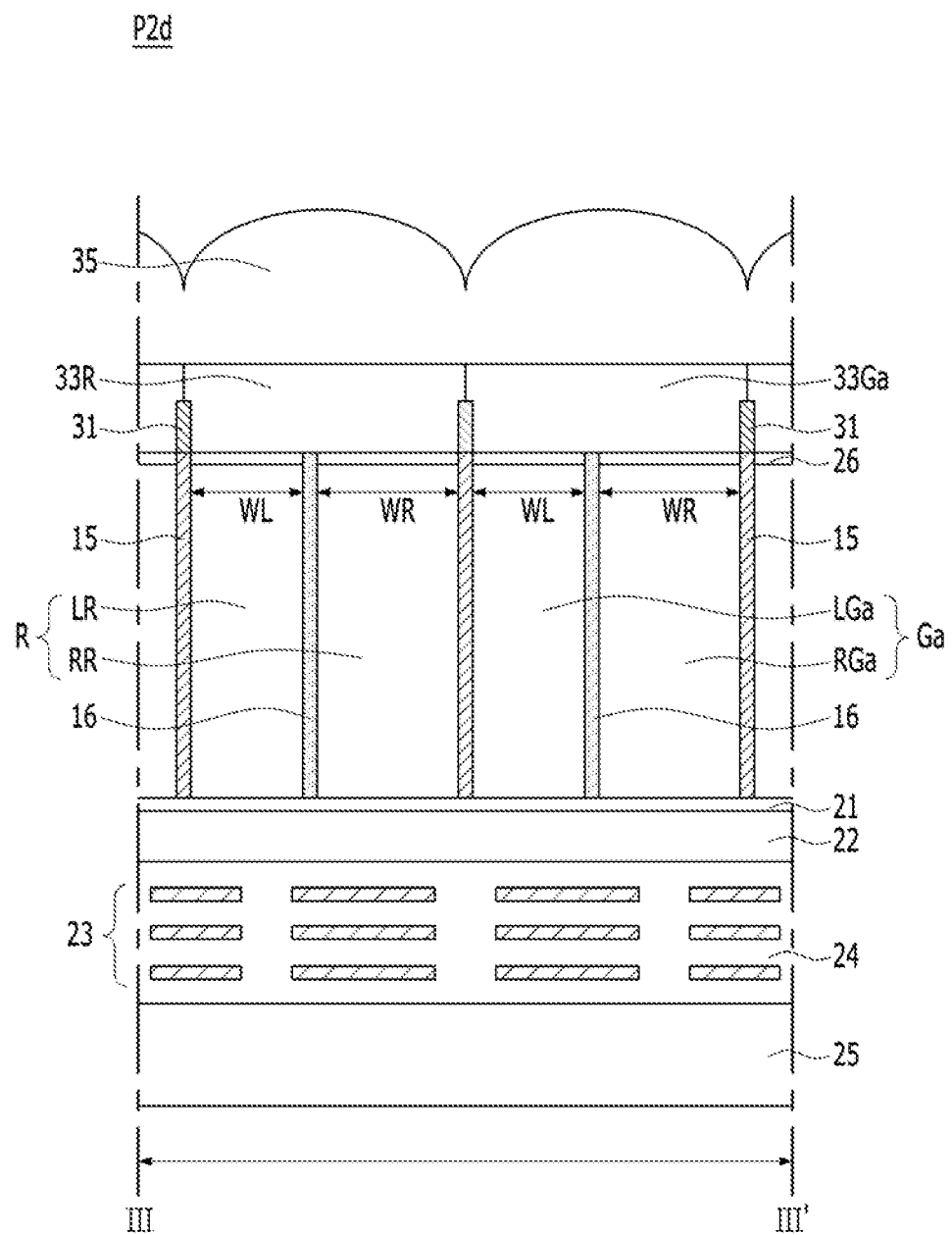

Referring to FIGS. 4A to 4C, each of the pixels P1, P2a, P2b, P2c and P2d in accordance with the embodiments of the present invention may include photodiodes LR, RR, LGa, RGa, LGb, RGb, LB, and RB, a bottom-surface insulating layer 21, a first interlayer dielectric layer 22, a metal interconnection layer 23, a second interlayer dielectric layer 24, a support substrate 25, a top-surface insulating layer 26, first grid patterns 31, color filters 33R, 33Ga, 33Gb, and 33B and microlenses 35. Although the photodiodes RGb, LGb, LB and RB, and the color filters 33Gb and 33B are not shown in FIGS. 4A to 4C, it is apparent from FIGS. 3A to 3C and FIGS. 4D and 4E that each of the pixels P1, P2a, P2b, P2c and P2 may include the photodiodes RGb, LGb, LB and RB, and the color filters 33Gb and 33B.

The bottom-surface insulating layer 21, the first interlayer dielectric layer 22, the metal interconnection layer 23, the second interlayer dielectric layer 24 and the support substrate 25 may be formed under the photodiodes LR, RR, LGa, RGa, LGb, RGb, LB, and RB. The top-surface insulating layer 26, the first grid patterns 31, the color filters 33R, 33Ga, 33Gb, and 33B and the microlenses 35 may be formed over the photodiodes LR, RR, LGa, RGa, LGb, RGb, LB, and RB. The photodiodes LR, RR, LGa, RGa, LGb, RGb, LB, and RB may include left photodiodes LR, LGa, LGb, and LB and right photodiodes RR, RGa, RGb, and RB, the left photodiode and the right photodiode being optically and electrically isolated from each other and defined by the PD isolation regions 16. The combinations LR-RR, LGa-RGa, LGb-RGb and LB-RB of the photodiodes LR, RR, LGa, RGa, LGb, RGb, LB, and RB may form unit pixels R, Ga, Gb, and B, each of which is optically and electrically isolated and defined by pixel isolation regions 15. That is, the unit pixels R, Ga, Gb, and B may include photodiode pairs LR-RR, LGa-RGa, LGb-RGb, and LB-RB, respectively. The pixel isolation regions 15 and the PD isolation regions 16 may include Deep Trench Isolation (DTI) regions. Specifically, the pixel isolation regions 15 and the PD isolation regions 16 may include insulators filled into trenches formed vertically through the unit pixels R, Ga, Gb, and B.

Figure 4D:
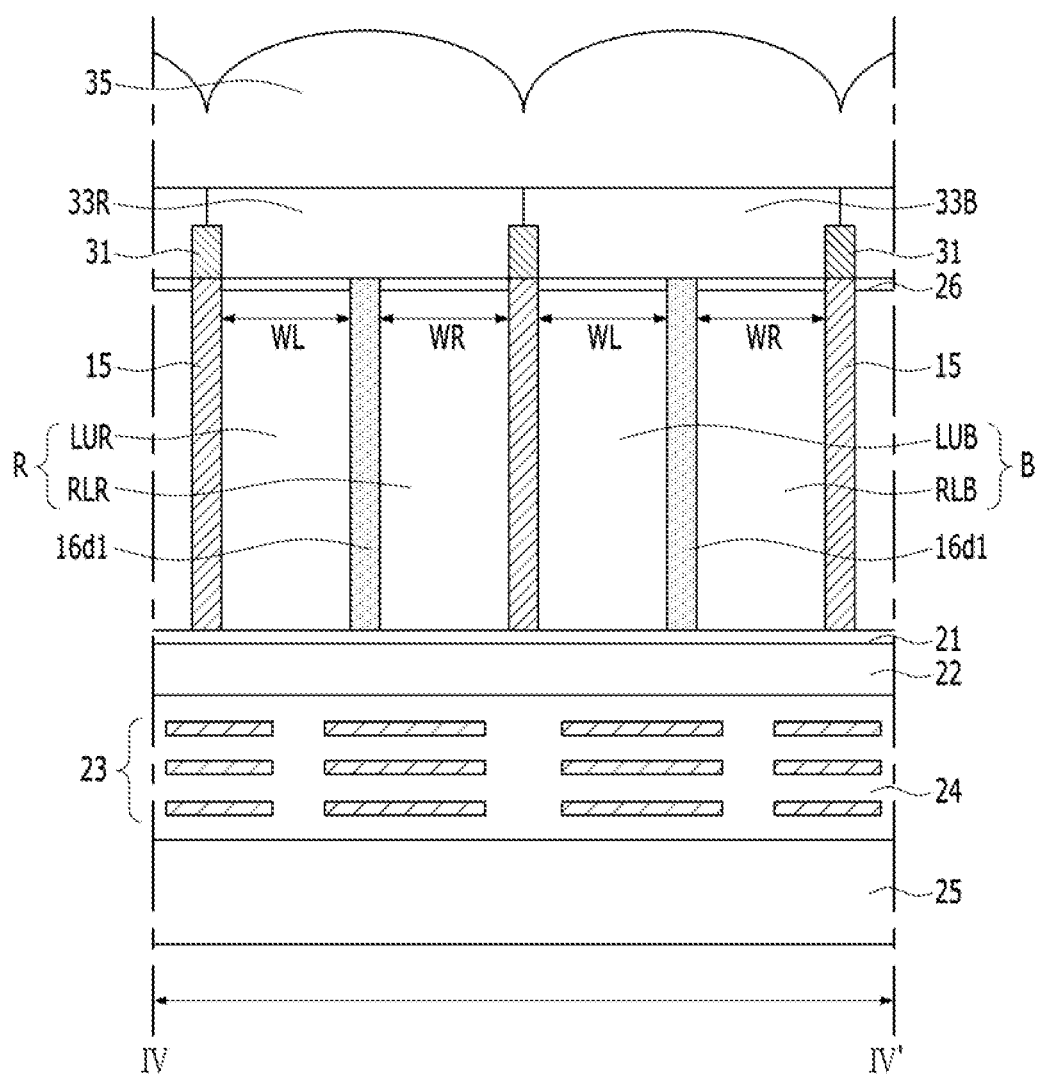
Figure 4E:
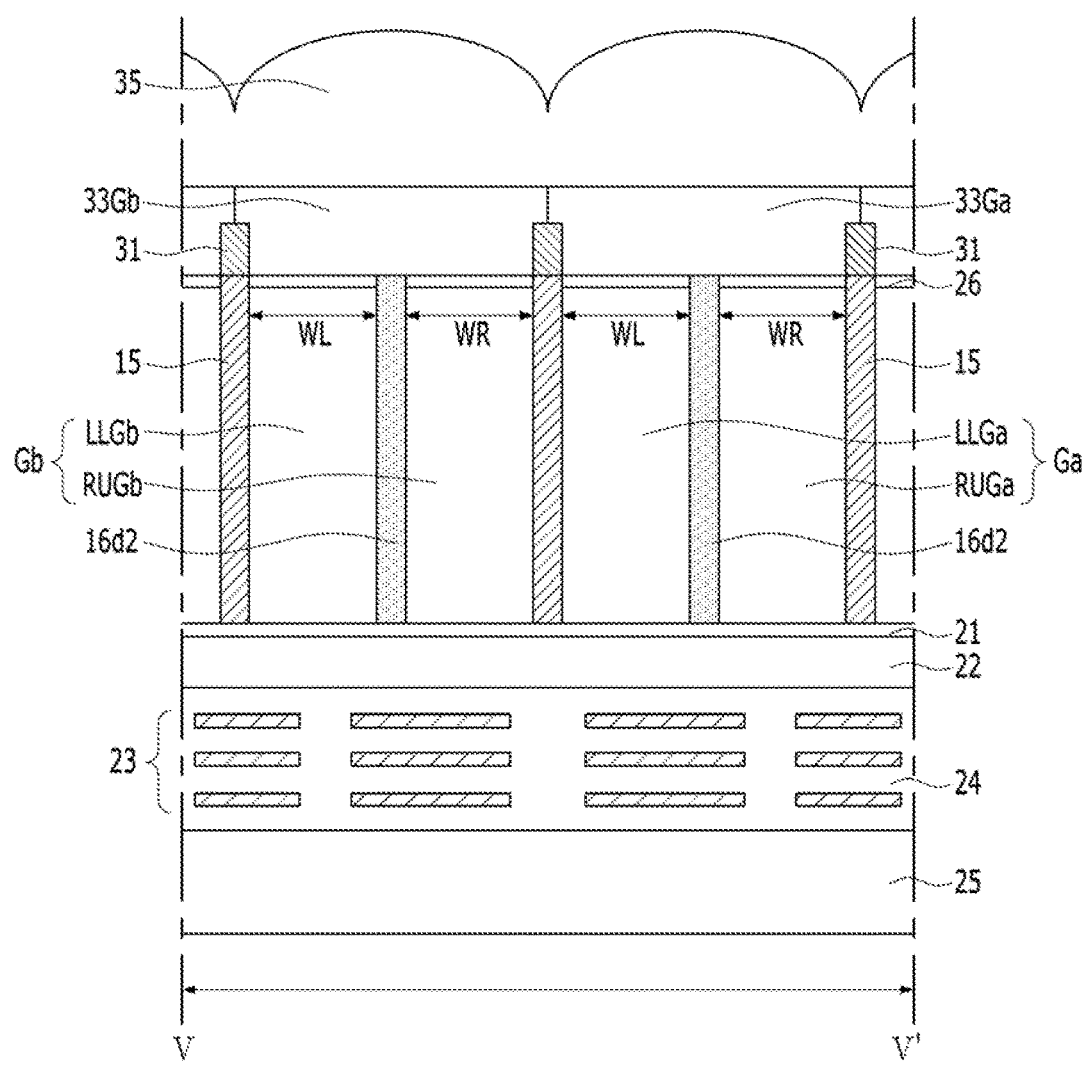

Referring to FIGS. 4D and 4E, each of the pixels P3a, P3d, P3b and P3c in accordance with the embodiments of the present invention may include the unit pixels R, Ga, Gb, and B, each of which is optically and electrically isolated and defined by the pixel isolation regions 15. The unit pixels R, Ga, Gb, and B may include photodiode pairs LUR-RLR, LUGa-RLGa, LUGb-RLGb, LUB-RLB, LLR-RUR, LLGa-RUGa, LLGb-RUGb, and LLB-RUB, respectively, the photodiode pairs being optically and electrically isolated and defined as the left photodiodes and the right photodiodes by the PD isolation regions 16d1 and 16d2 extending in diagonal directions. Although the photodiodes LUGa, RLGa, LUGb, RLGb, LLR, RUR, LLB and RUB are not shown in FIGS. 4D and 4E, it is apparent from FIGS. 3D and 3E that each of the pixels P3a and P3d may include the photodiodes LUGa, RLGa, LUGb and RLGb and each of the pixels P3b and P3c may include the photodiodes LLR, RUR, LLB and RUB.

The bottom-surface insulating layer 21, the first interlayer dielectric layer 22, the second interlayer dielectric layer 24, and the top-surface insulating layer 26 may include a silicon oxide, a silicon nitride, a silicon oxynitride or one of combinations thereof. The metal interconnection layer 23 may be formed in the second interlayer dielectric layer 24. The support substrate 25 may include an additional silicon substrate. The first grid patterns 31 may have a lattice shape which is substantially aligned with the pixel isolation regions 15 in a top view. Thus, the first grid patterns 31 may be vertically aligned with the pixel isolation regions 15. The first grid patterns 31 may include an opaque material to block and separate light, for example, a metal such as tungsten (W). The color filters 33R, 33Ga, 33Gb, and 33B may be substantially vertically aligned with the unit pixels R, Ga, Gb, and B, respectively. For example, the color filters 33R, 33Ga, 33Gb, and 33B may be formed in windows formed by the first grid patterns 31 in a top view. Each of the microlenses 35 may be substantially vertically aligned with one of the color filters 33R, 33Ga, 33Gb, and 33B and one of the unit pixels R, Ga, Gb, and B. That is, each of the photodiode pairs LR-RR, LGa-RGa, LGb-RGb, and LB-RB may share one of the color filters 33R, 33Ga, 33Gb, and 33B and one of the microlenses 35.

In FIGS. 4A to 4D, parts of the pixel isolation region 15 and the PD isolation regions 16, 16d1, and 16d2 may be replaced with ion-doped regions. For example, the lower parts of the pixel isolation region 15 and the PD isolation regions 16, 16d1 and 16d2, which are adjacent to the bottom-surface insulating layer 21, may be replaced with P-type ion-doped regions instead of DTI regions.

Referring to FIGS. 3A and 4A, the unit pixels R, Ga, Gb, and B of the pixels P1 in the central region 11, the top-side edge region 12a and the bottom-side edge region 12b may have the left photodiodes LR, LGa, LGb, and LB and the right photodiodes RR, RGa, RGb, and RB, respectively, which are equally isolated by the pixel isolation regions 15. That is, the width WL of the left photodiodes LR, LGa, LGb and LB, may be substantially equal to the width WR of the right photodiodes RR, RGa, RGb, and RB (WL=WR).

Referring to FIGS. 3B and 4B, the unit pixels R, Ga, Gb, and B of the pixel P2c in the left-side edge region 12c may include the left photodiodes LR, LGa, LGb, and LB having a relatively large size and the right photodiodes RR, RGa, RGb, and RB having a relatively small size, respectively. That is, the width WL of the left photodiodes LR, LGa, LGb, and LB may be larger than the width WR of the right photodiodes RR, RGa, RGb, and RB (WL>WR).

Referring to FIGS. 3C and 4C, the unit pixels R, Ga, Gb, and B of the pixel P2d in the right-side edge region 12d may include left photodiodes LR, LGa, LGb, and LB having a relatively small size and right photodiodes RR, RGa, RGb, and RB having a relatively large size, respectively. That is, the width WL of the left photodiodes LR, LGa, LGb, and LB may be smaller than the width WR of the right photodiodes RR, RGa, RGb, and RB (WL<WR).

Referring to FIGS. 3D and 4D, the unit pixels R, Ga, Gb, and B of the pixels P3a and P3d in the left-top corner region 13a and the right-bottom corner region 13d may include the left-top photodiodes LUR, LUGa, LUGb, and LUB and the right-bottom photodiodes RLR, RLGa, RLGb, and RLB, respectively, which have substantially the same size (or same volume). The maximum width WL of the left-top photodiodes LUR, LUGa, LUGb, and LUB in the diagonal direction may be substantially equal to the maximum width WR of the right-bottom photodiodes RLR, RLGa, RLGb, and RLB in the diagonal direction (WL=WR).

Referring to FIGS. 3E and 4E, the unit pixels R, Ga, Gb, and B of the pixels P3b and P3c in the right-top corner region 13b and the left-bottom corner region 13c may include the left-bottom photodiodes LLR, LLGa, LLGb, and LLB and the right-top photodiodes RUR, RUGa, RUGb, and RUB, respectively, which have substantially the same size (or same volume). The maximum width WL of the left-bottom photodiodes LLR, LLGa, LLGb, and LLB in the diagonal direction may be substantially equal to the maximum width WR of the right-top photodiodes RUR, RUGa, RUGb, and RUB in the diagonal direction (WL=WR).

Figure 5A:
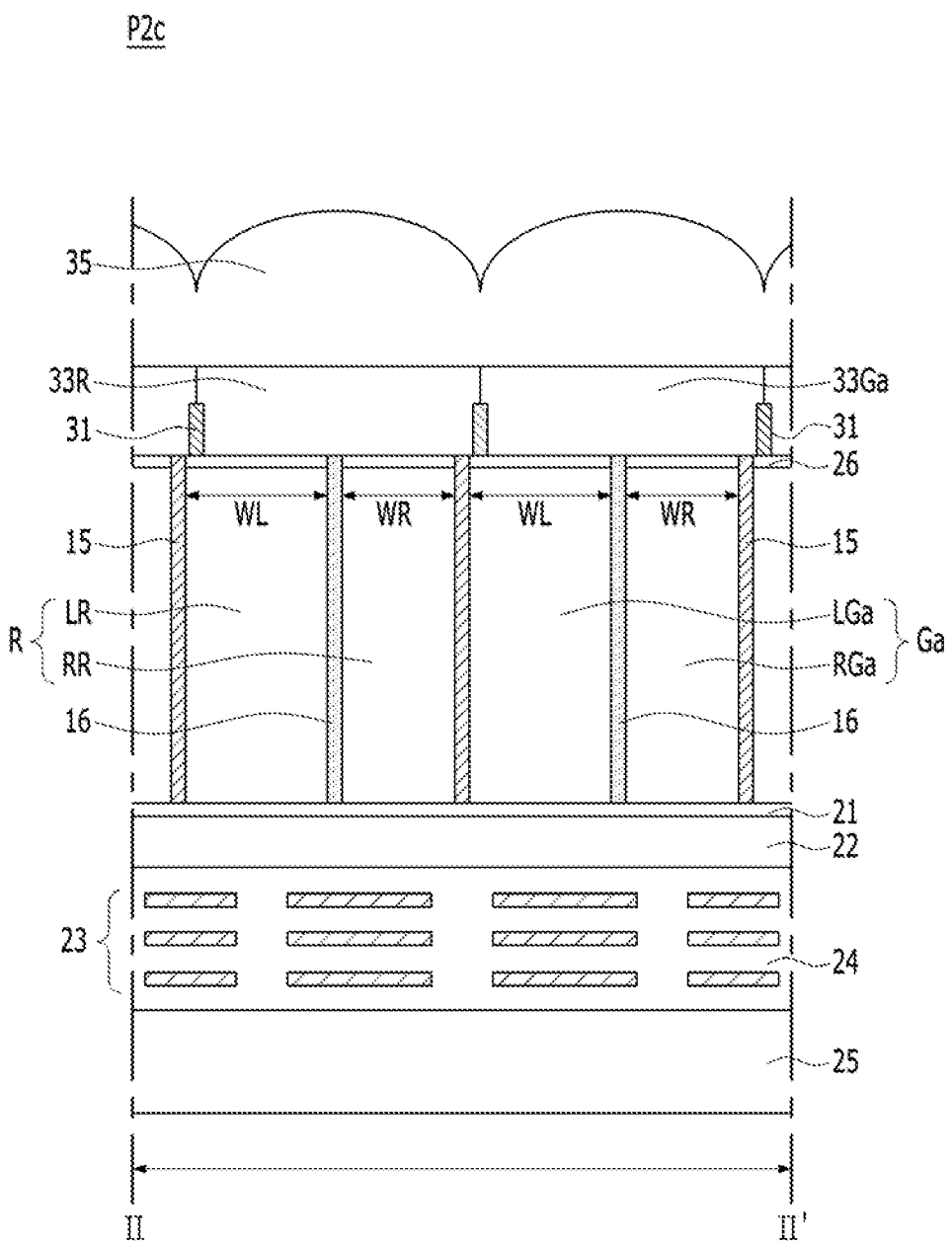
FIGS. 5A to 5D are cross-sectional views of the pixels shown in FIGS. 3B to 3E, taken along II-II' to V-V' lines of FIGS. 3B to 3E, respectively.

Referring to FIG. 5A, the first grid patterns 31, the color filters 33R, 33Ga, 33Gb, and 33B and the microlenses 35 in the pixel P2c of the left-side edge region 12c may be shifted toward the center of the pixel array 810, compared to FIG. 4B. Thus, parts of the first grid patterns 31, the color filters 33R, 33Ga, 33Gb, and 33B and the microlenses 35 may vertically overlap with parts of the left photodiodes LR, LGa, LGb, and LB adjacent to right wall surfaces of the pixel isolation regions 15.

Figure 5B:
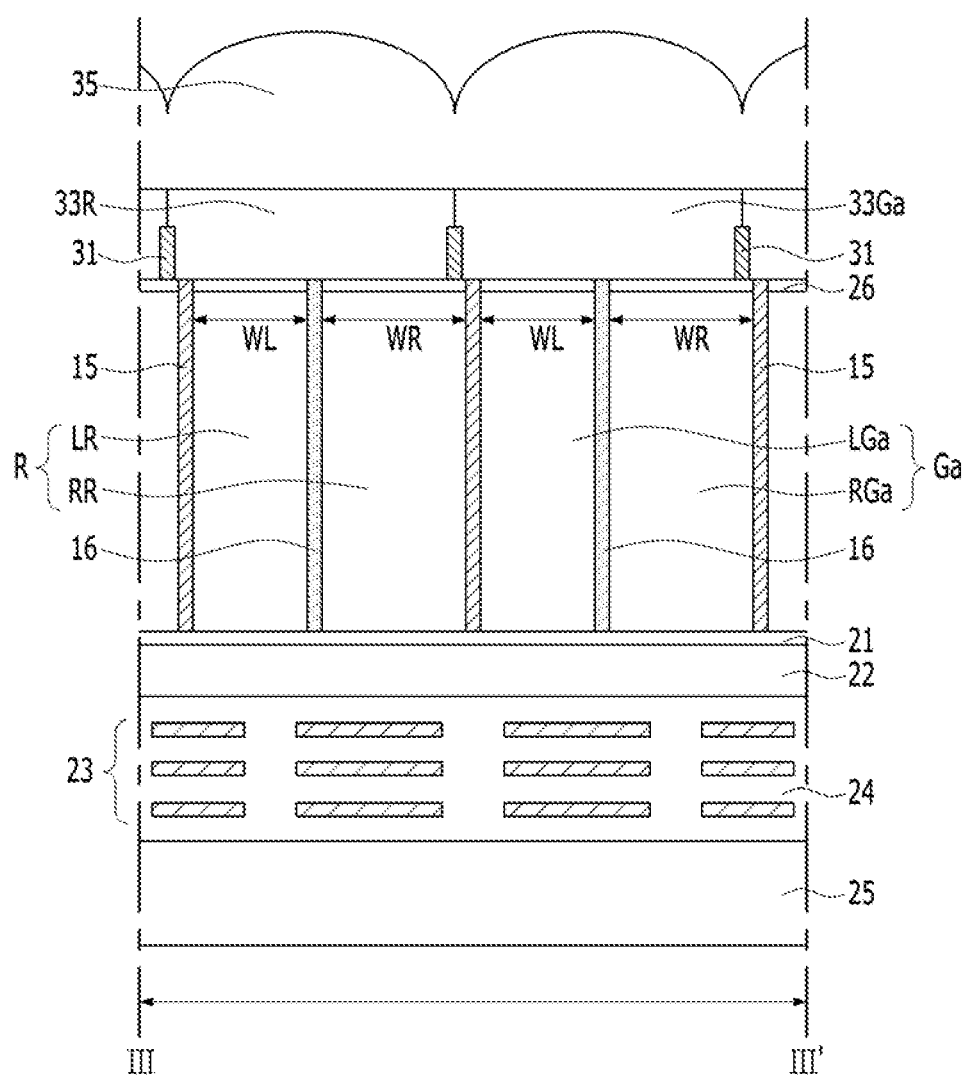

Referring to FIG. 5B, the first grid patterns 31, the color filters 33R, 33Ga, 33Gb, and 33B and the microlenses 35 in the pixel P2d of the right-side edge region 12d may be shifted toward the center of the pixel array 810, compared to FIG. 4C. Thus, parts of the first grid patterns 31, the color filters 33R, 33Ga, 33Gb, and 33B and the microlenses 35 may vertically overlap with parts of the right photodiodes RR, RGa, RGb, and RB adjacent to left wall surfaces of the pixel isolation regions 15.

Figure 5C:
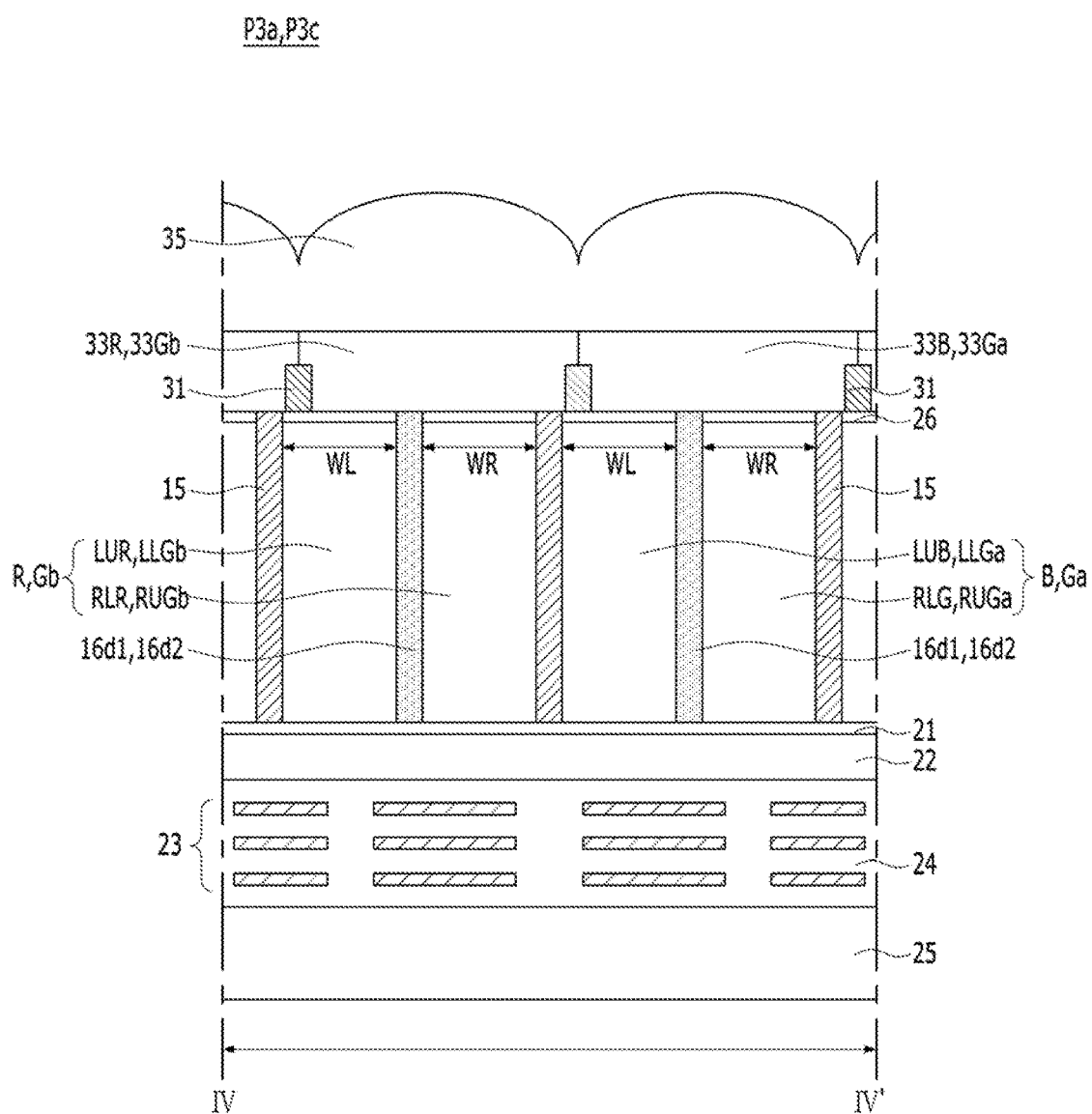

Referring to FIG. 5C, the first grid patterns 31, the color filters 33R, 33Ga, 33Gb, and 33B and the microlenses 35 in the pixels P3a and P3c of the left-top corner region 13a and the left-bottom corner region 13c may be shifted toward the right side of the pixel array 810, compared to FIGS. 4D and 4E. Thus, parts of the first grid patterns 31, the color filters 33R, 33Ga, 33Gb, and 33B and the microlenses 35 may vertically overlap with parts of the left-top or left-bottom photodiodes LUR, LLGa, LLGb, and LUB adjacent to the right wall surfaces of the pixel isolation regions 15. Alternatively, the first grid patterns 31, the color filters 33R, 33Ga, 33Gb, and 33B and the microlenses 35 in the pixels P3a and P3c of the left-top corner region 13a and the left-bottom corner region 13c may be shifted toward the center of the pixel array 810, compared to FIGS. 4D and 4E.

Figure 5D:
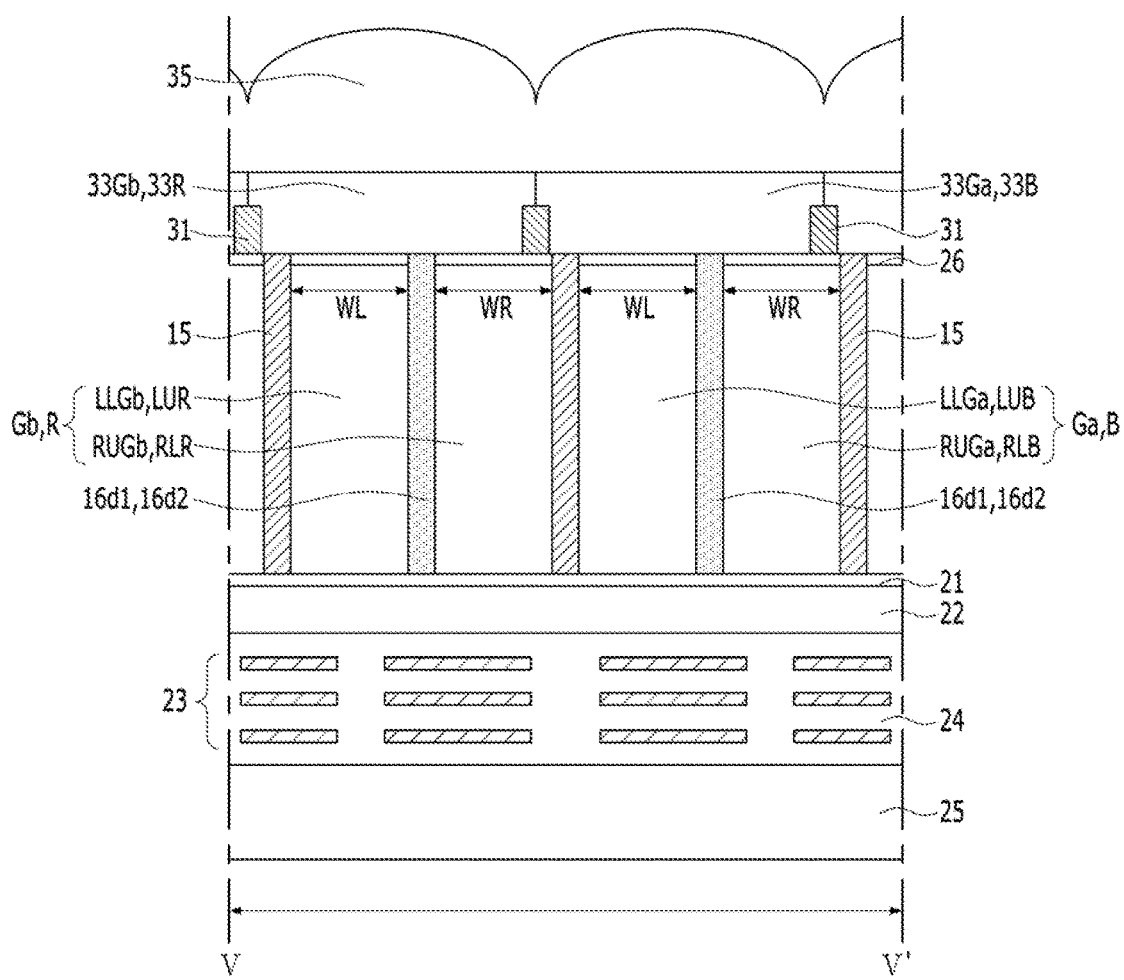
Figure 6A:
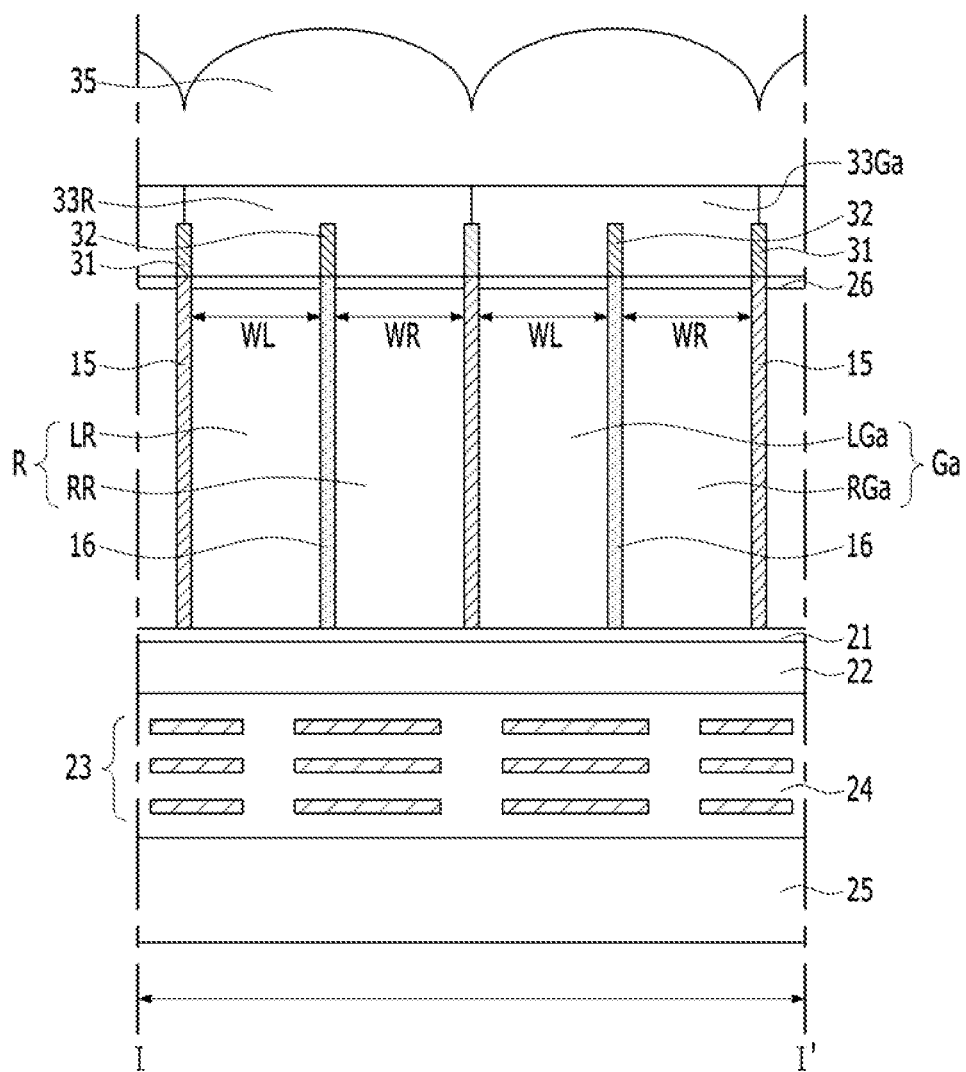
FIGS. 6A to 6E are cross-sectional views of the pixels shown in FIGS. 3A to 3E, taken along I-I' to V-V' lines of FIGS. 3A to 3E, respectively.
Figure 6B:
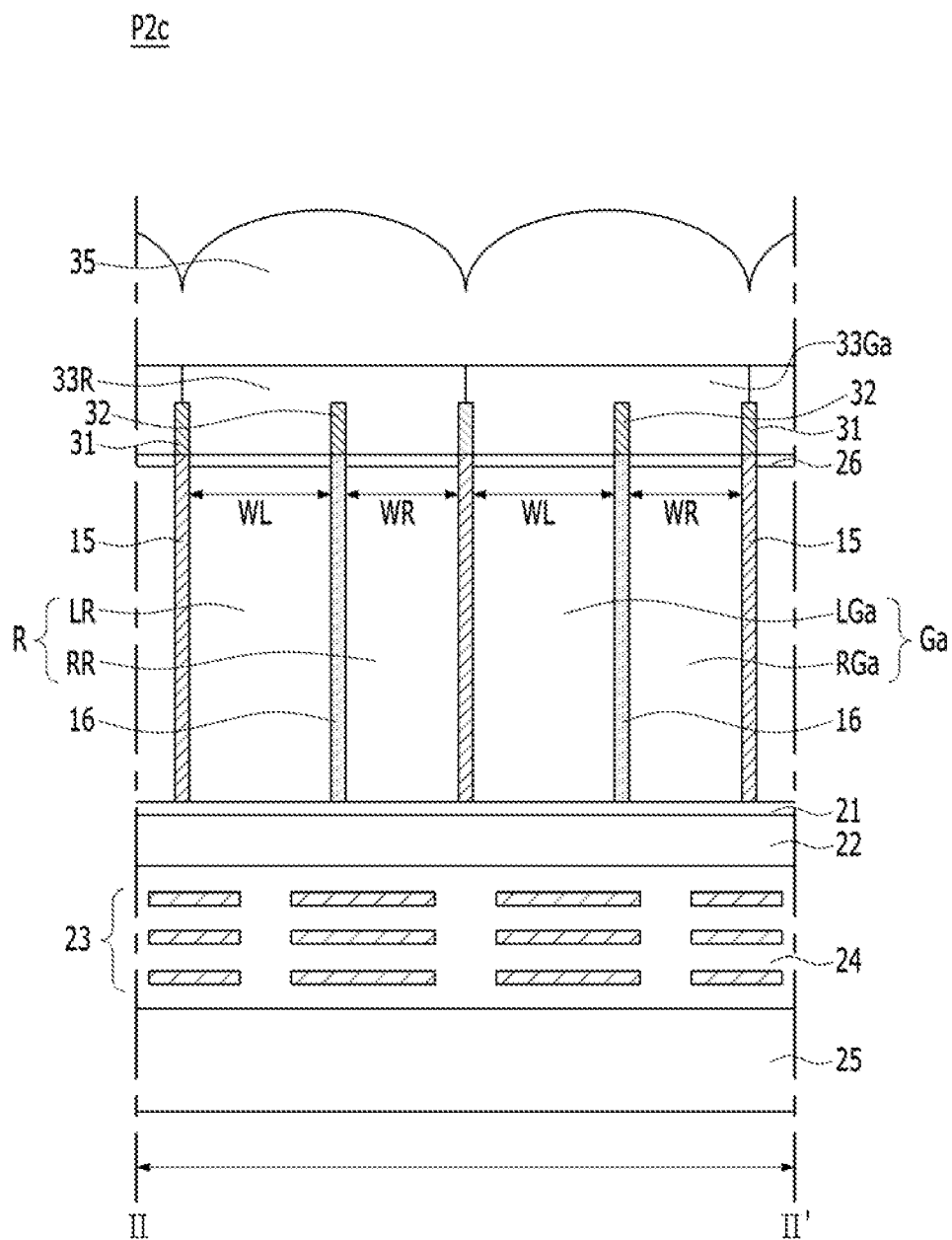
Figure 6C:
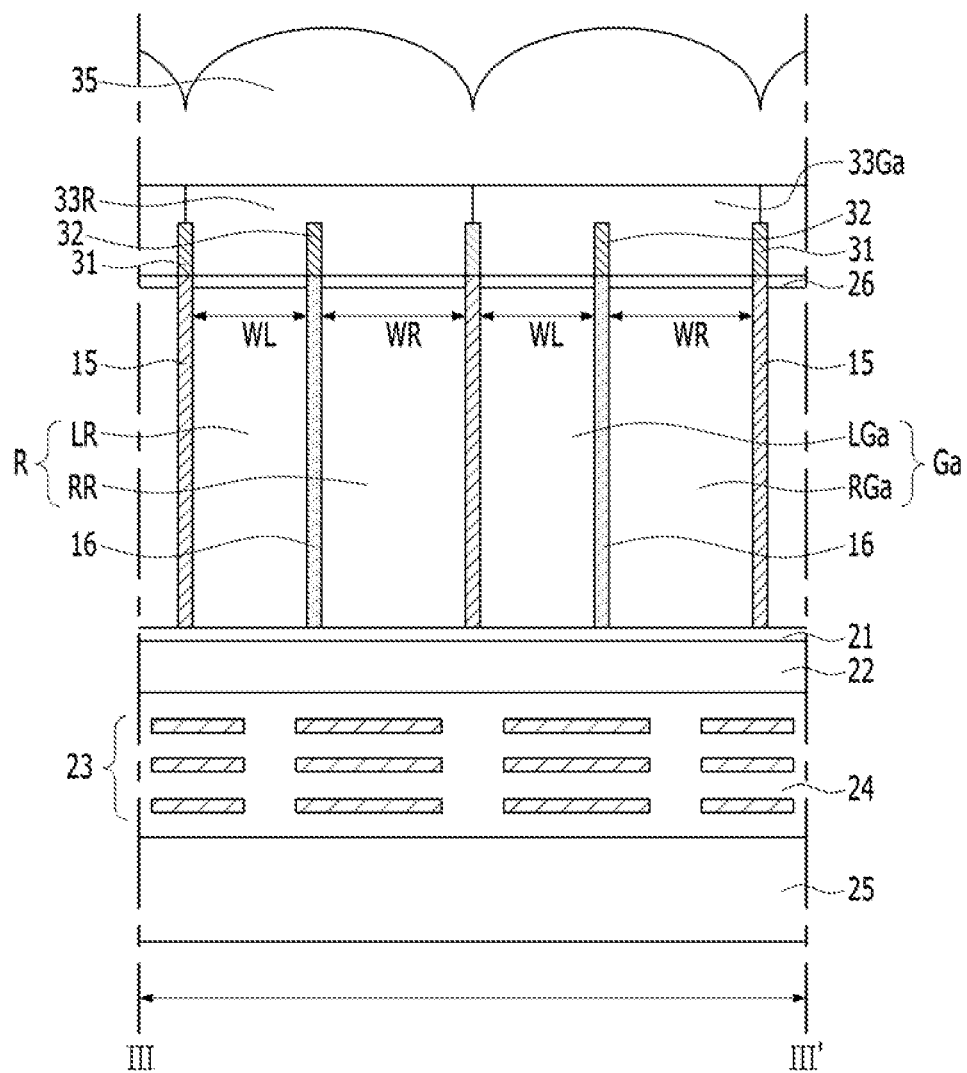
Figure 6D:
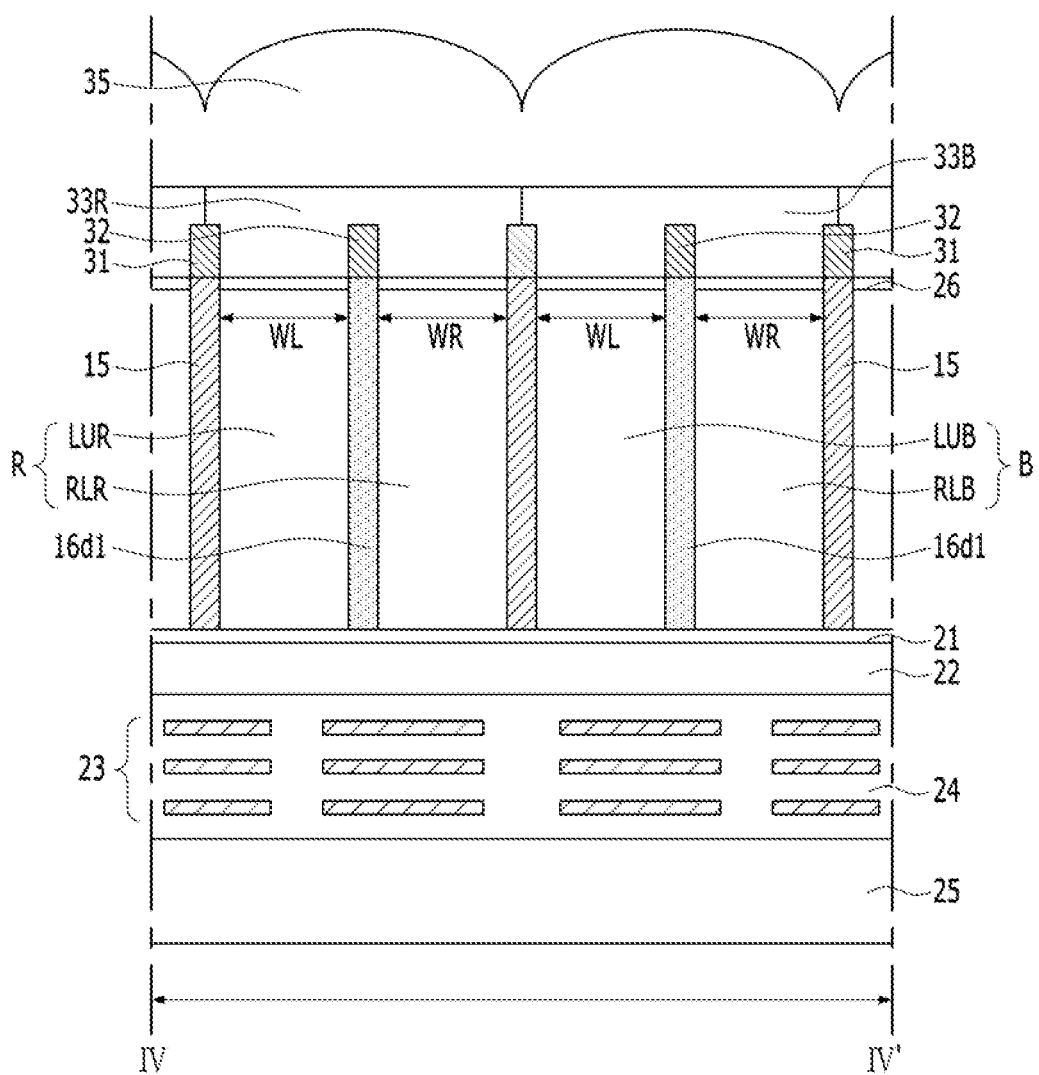
Figure 6E:
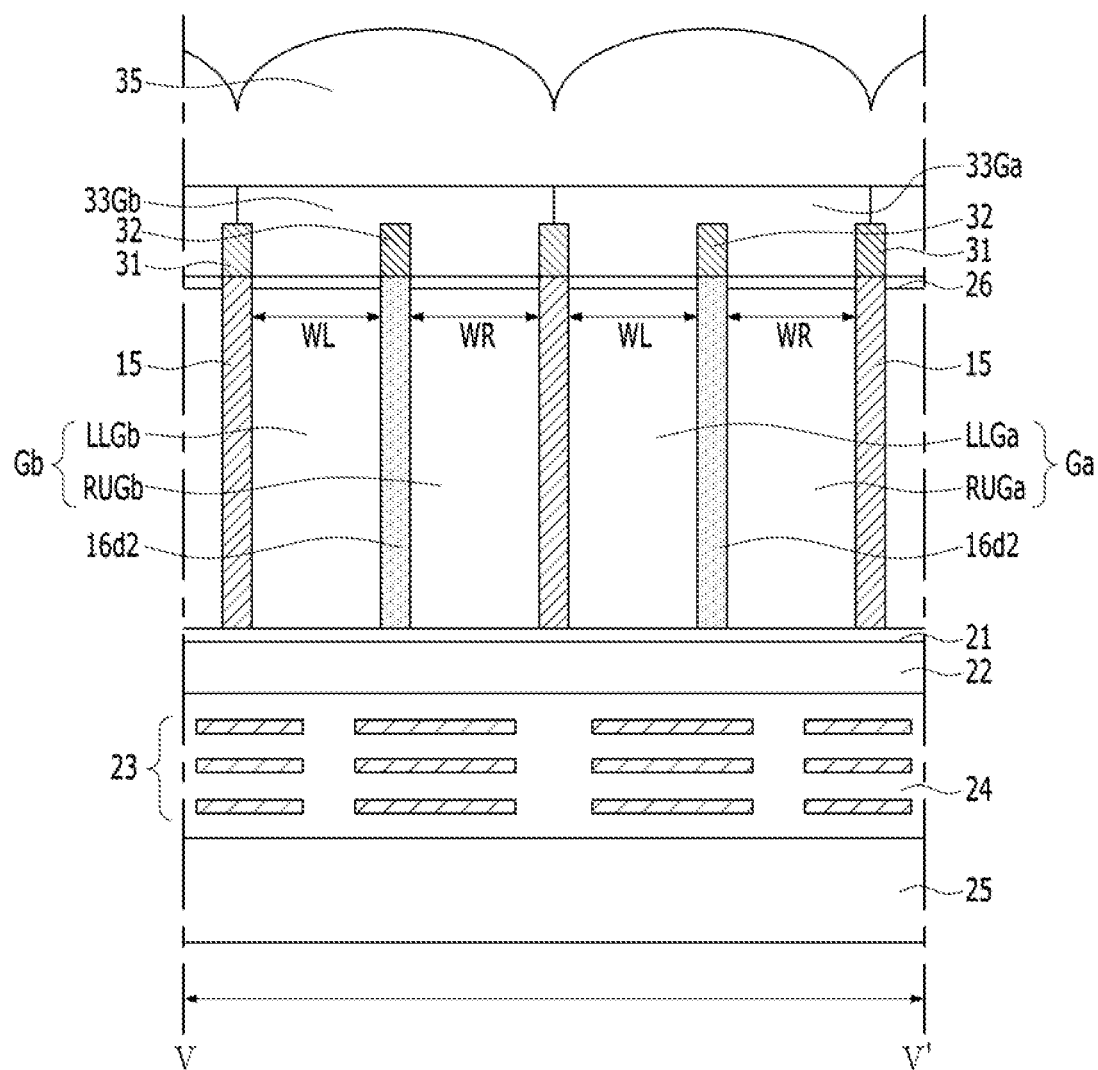
Figure 7A:
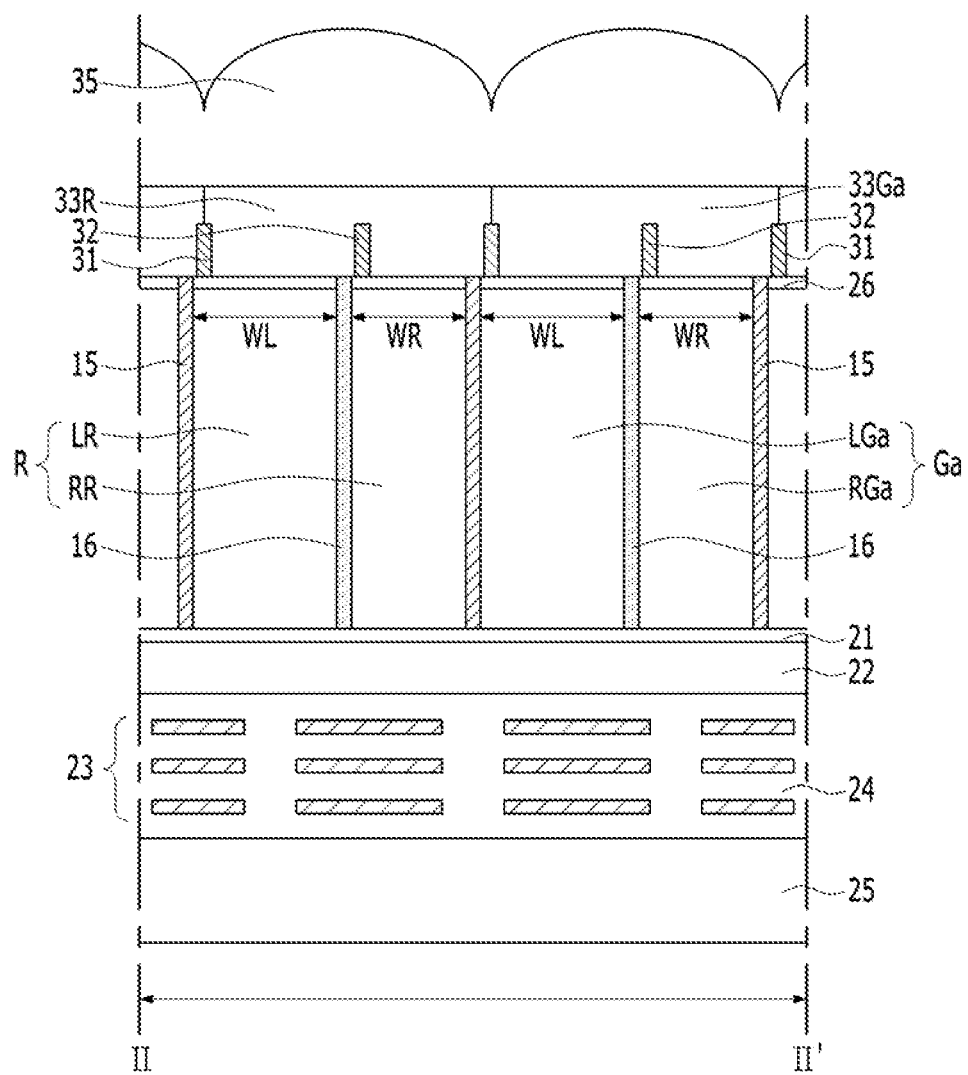
FIGS. 7A to 7D are cross-sectional views of the pixels shown in FIGS. 3B to 3E, taken along II-II' to V-V' lines of FIGS. 3B to 3E, respectively.
Figure 7B:
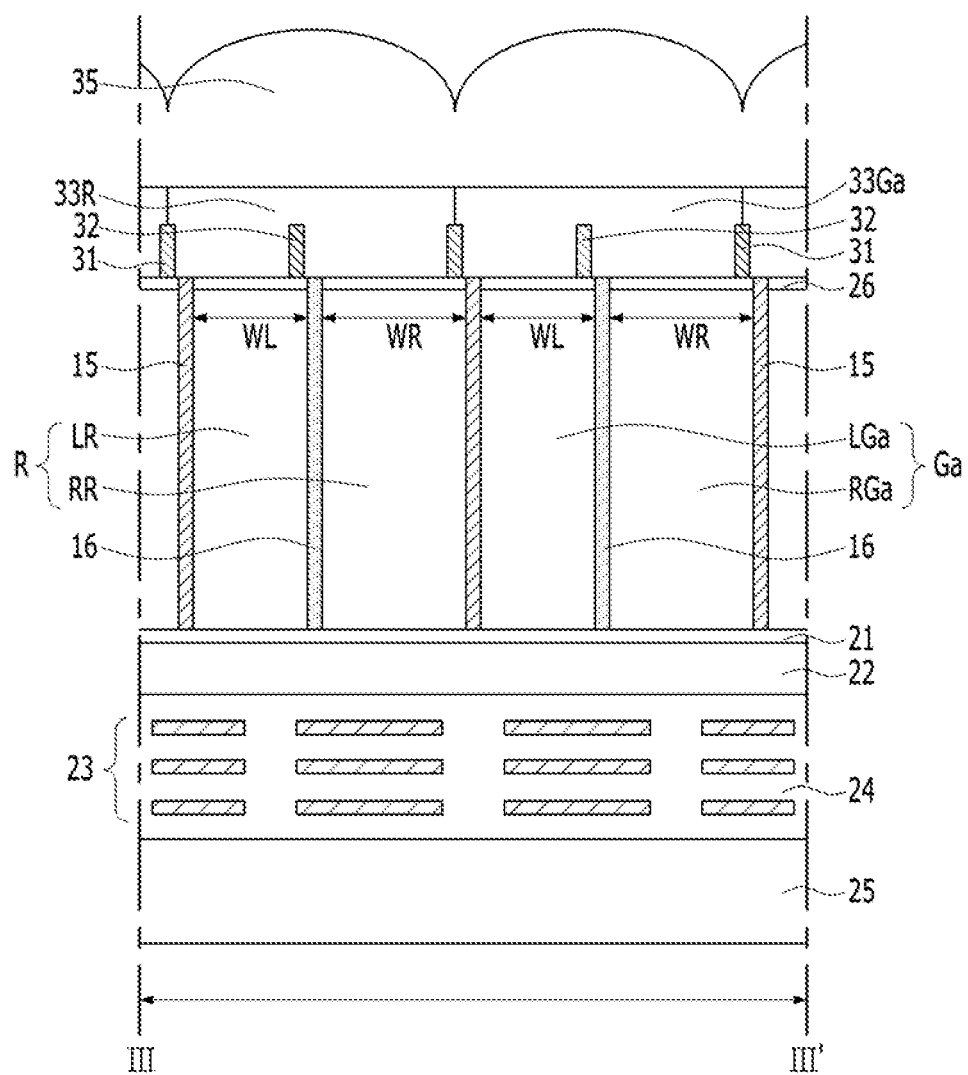
Figure 7C:
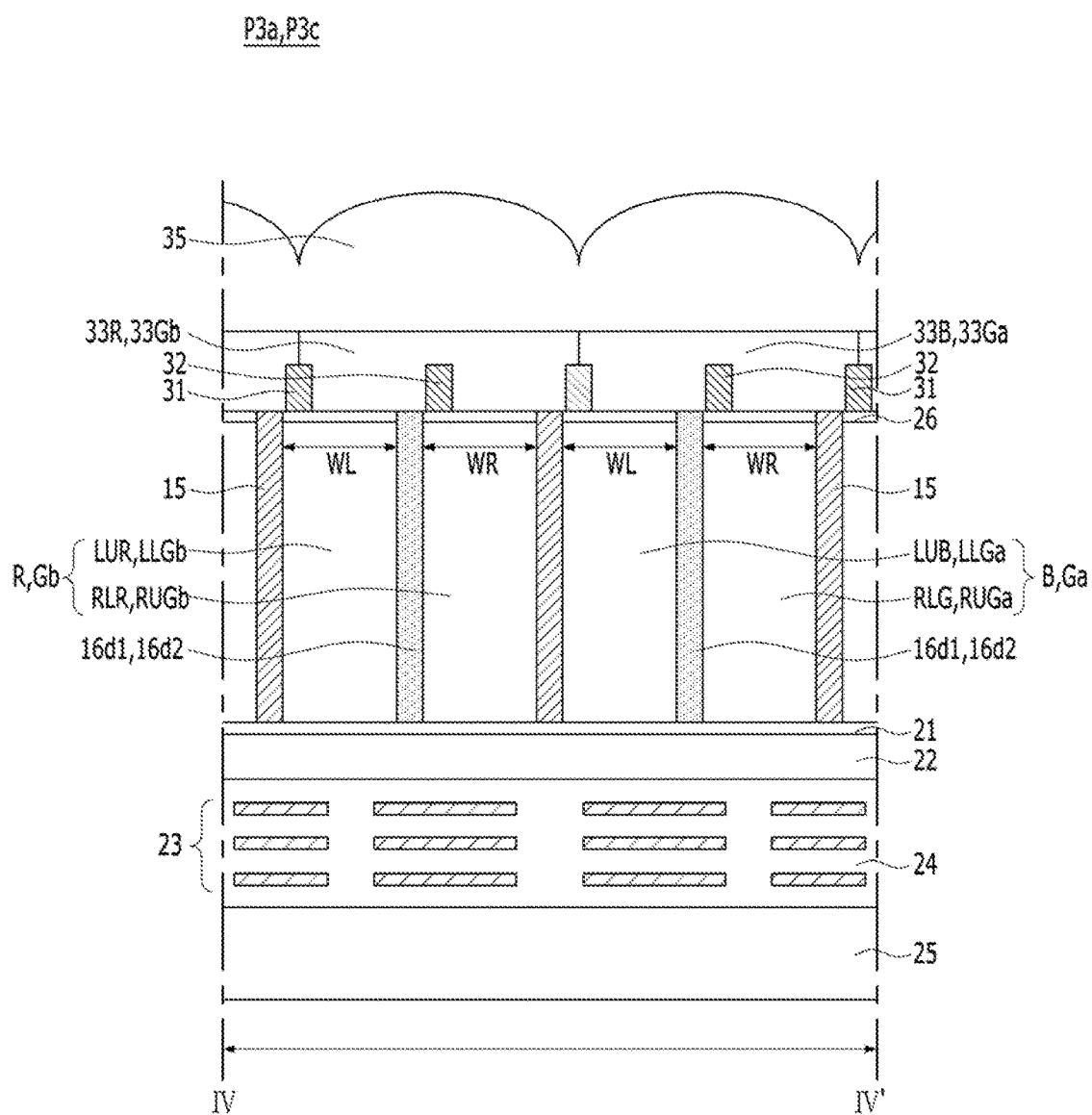
Figure 7D:
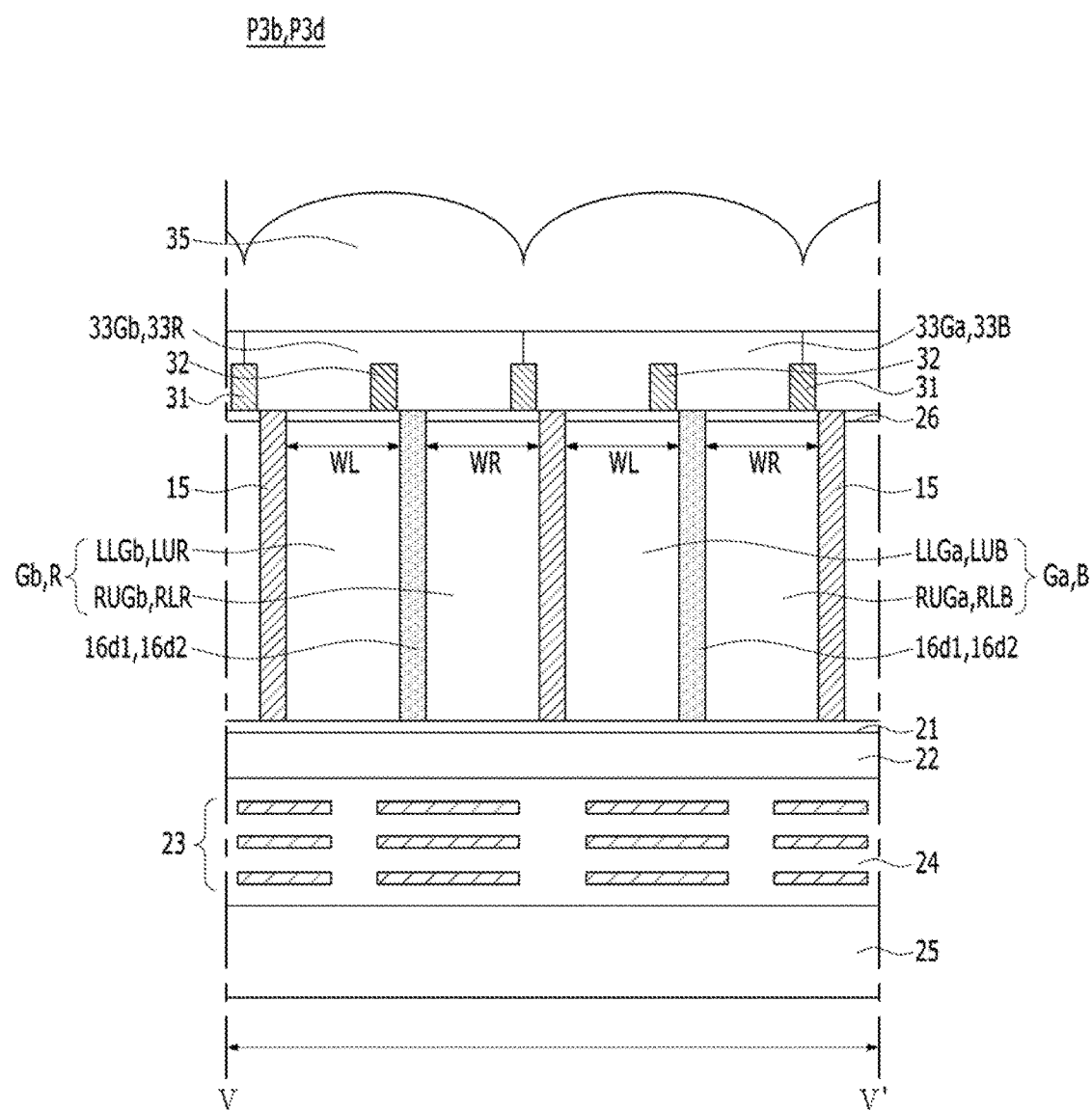

Referring to FIG. 5D, the first grid patterns 31, the color filters 33R, 33Ga, 33Gb, and 33B and the microlenses 35 in the pixels P3b and P3d of the right-top corner region 13b and the right-bottom corner region 13d may be shifted toward the left side of the pixel array 810, compared to FIGS. 4D and 4E. Thus, parts of the first grid patterns 31, the color filters 33R, 33Ga, 33Gb, and 33B and the microlenses 35 may vertically overlap with parts of the right photodiodes RR, RGa, RGb, and RB adjacent to left wall surfaces of the pixel isolation regions 15. Alternatively, the first grid patterns 31, the color filters 33R, 33Ga, 33Gb, and 33B and the microlenses 35 in the pixels P3b and P3d of the right-top corner region 13b and the right-bottom corner region 13d may be shifted toward the center of the pixel array 810, compared to FIGS. 4D and 4E.

Therefore, referring to FIGS. 5A to 5D, the first grid patterns 31 may partly overlap with the pixel isolation regions 15 in a top view. Specifically, the first grid patterns 31 extending in the row direction may still overlap with the pixel isolation regions 15, and the first grid patterns 31 extending in the column direction may not overlap with the pixel isolation regions 15.

Referring to FIGS. 6A to 6E, the pixels in accordance with yet other embodiments of the present invention may further include second grid patterns 32, compared to the pixels illustrated in FIGS. 4A to 4E. The second grid patterns 32 may be substantially vertically aligned with the PD isolation regions 16, 16d1, and 16d2 in a top view. The second grid patterns 32 may include the same material as the first grid patterns 31, and be formed at the same time through the same process.

Referring to FIGS. 7A to 7D, the pixels in accordance with yet other embodiments of the present invention may further include second grid patterns 32 shifted toward the center, the right side or the left side, compared to the pixels illustrated in FIGS. 5A to 5D. Thus, referring to FIGS. 7A to 7D, the second grid patterns 32 may have the same layout as the PD isolation regions 16, 16d1, and 16d2, but not overlap with the PD isolation regions 16, 16d1, and 16d2 in a top view.

Figure 8A:
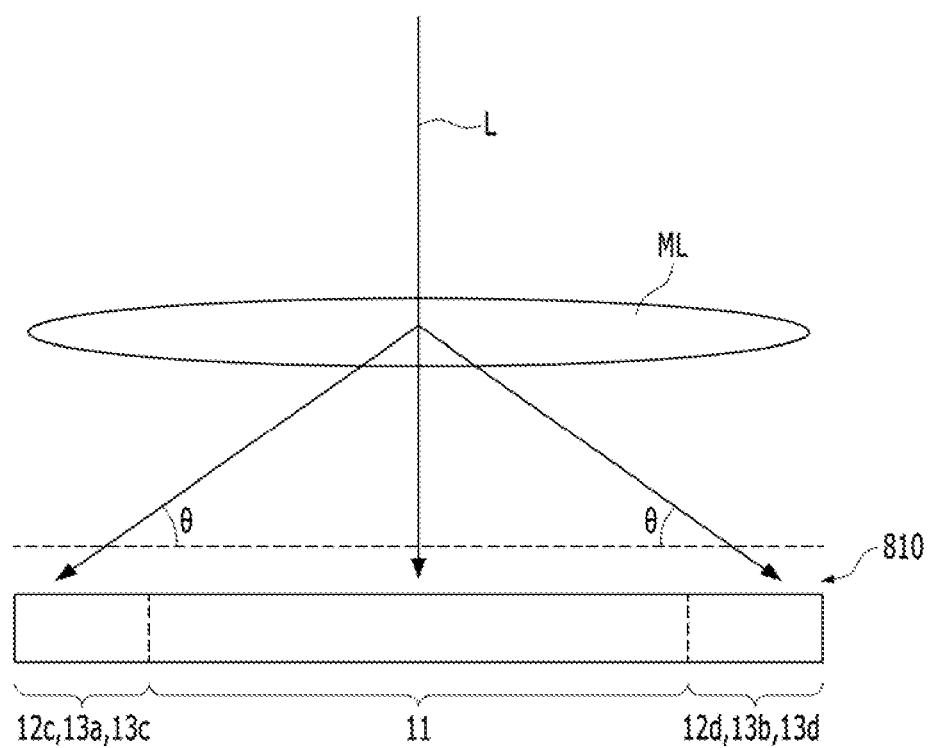
FIG. 8A is a diagram describing an arrangement of PD separation regions in a central region, edge regions and corner regions of a pixel array in accordance with an embodiment of the present invention.

Referring to FIG. 8A, light L may be transmitted through a module lens ML of an image sensor module. At this time, the light L may be vertically incident toward the center of the pixel array 810, or obliquely incident toward the peripheral regions of the pixel array 810, that is, the edge regions 12a to 12d and the corner regions 13a to 13d. Thus, the amounts of light L incident on the peripheral regions of the pixel array 810 may be non-linearly changed. Specifically, since the incident angle θ of the light L decreases toward the outermost sides of the pixel array 810, the amount of light L received by the photodiodes of the pixels in the peripheral regions may be relatively reduced.

Figure 8B:
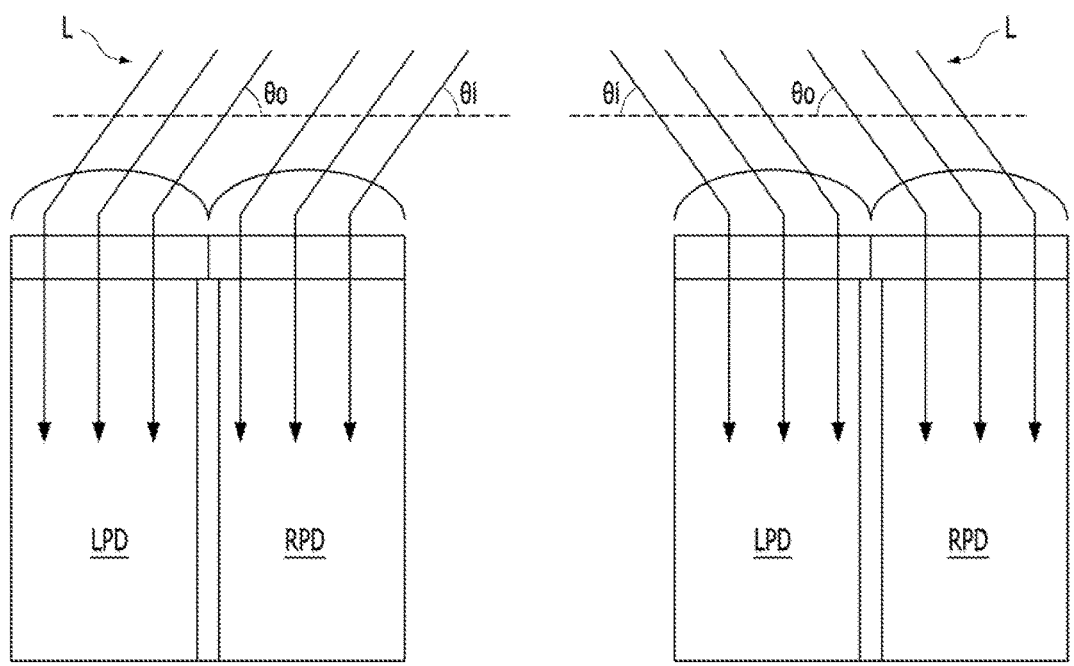
FIG. 8B is a diagram illustrating a technical concept for correcting a non-linearity in an amount of received light.

Referring to FIG. 8B, in case of the left-side edge region 12c, an incident angle θo of the light L on a left photodiode LPD may be smaller than an incident angle θi of the light L on a right photodiode RPD. Thus, the amount of light L incident on the left photodiode LPD may be smaller than that on the right photodiode RPD. Furthermore, in case of the right-side edge region 12d, an incident angle θo of the light L on a right photodiode RPD may be smaller than an incident angle θi of the light L on a left photodiode LPD. Thus, the amount of light L incident on the right photodiode RPD may be smaller than that on the left photodiode LPD.

That is, the closer the photodiodes are to the outermost sides of the pixel array 810, the amounts of light L received by the photodiodes may be reduced. Thus, the volume of the photodiode LPD or RPD closer to the outermost side of the pixel array 810 out of a pair of photodiodes of the unit pixel needs to be increased in order to equalize the amounts of light received by the left photodiode LPD and the right photodiode RPD.

Figure 8C:
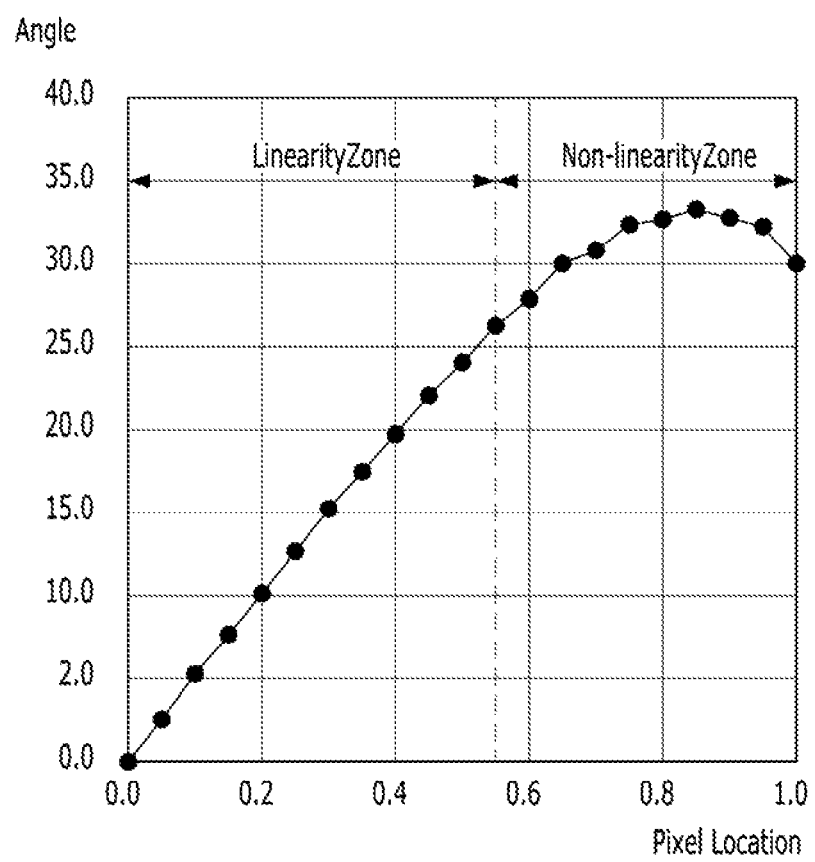
FIG. 8C is a graph illustrating that the amount of received light is changed depending on the locations of pixels within the pixel array.

FIG. 8C is a graph illustrating that the amount of received light L differs depending on the locations of the pixels in the pixel array 810, with reference to FIG. 8A. In FIG. 8C, the X-axis indicates the locations of the pixels in the pixel array 810 of the image sensor, and the Y-axis indicates the angles of light incident on the pixels. In the X-axis, the center of the pixel array 810 may be set to 0.0, and the edges of the pixel array 810 may be set to 1.0 (100%). Referring to FIG. 8C, when the locations of pixels fall within approximately 0.55 (55%) from the center (0.0) of the pixel array 810, the light intensity is linearly changed. However, when the locations of pixels exceed 0.55 (55%), the light intensity is non-linearly changed. At this time, when the locations of pixels fall within approximately 0.7 (70%), the change of the light intensity may be analyzed as a linear change to some extent. That is, when the locations of pixels exceed 0.7 (70%), the change of the light intensity may be analyzed as an apparent non-linear change. In other words, the amount of light received by the left photodiode LPD and the amount of light received by the right photodiode RPD may have a non-linear difference between. When the amounts of light received by the left photodiode LPD and the right photodiode RPD are linearly changed, the change may be easily corrected. However, when the amounts of light are non-linearly changed, the change may be difficult to correct. Thus, when the locations of pixels exceed 0.55 (55%), the volumes of the left photodiode LPD and the right photodiode RPD may be adjusted. Then, the amounts of light received by the left photodiode LPD and the right photodiode RPD may be linearly changed, and the color correction of the left photodiode LPD and the right photodiode RPD may be easily performed.

Figure 8D:
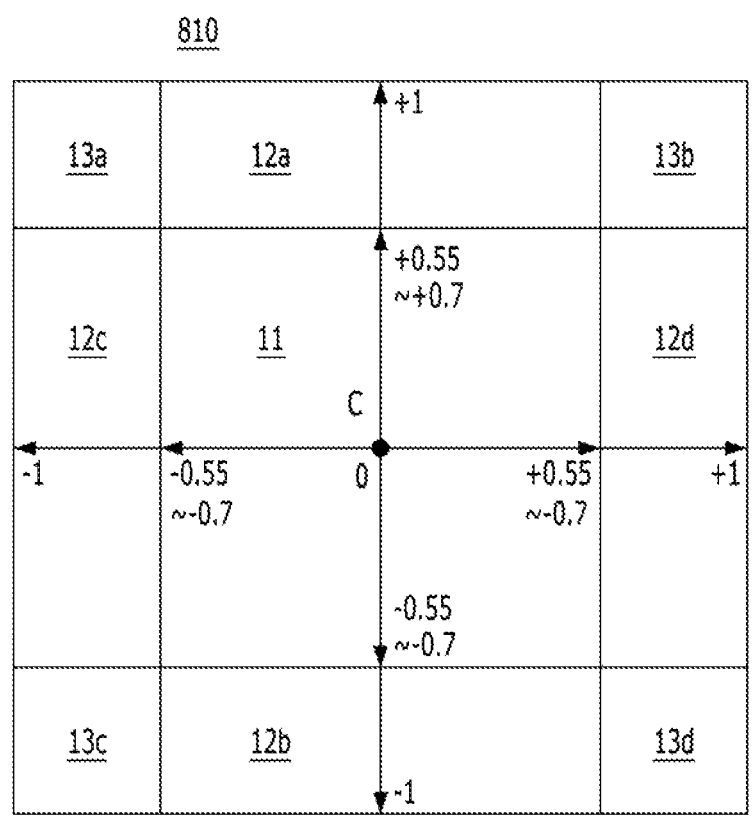
FIG. 8D is a diagram illustrating the pixel array of an image sensor divided into regions according to an embodiment of the present invention.

FIG. 8D is a diagram illustrating that the pixel array 810 of the image sensor are divided into the regions 11, 12a to 12d, and 13a to 13d, according to the measurement result of FIG. 8C. Referring to FIG. 8C, for example, the center of the pixel array 810 may be set to 0.0, and the left, right, top and bottom outermost sides of the pixel array 810 may be set to ±1.0 points (100%). The boundary lines between the central region 11 and the edge regions 12a to 12d in the pixel array 810 of the image sensor may be located in the range of about ±0.5 points (50%) to ±0.8 points (80%) away from the center of the pixel array 810 in the horizontal and vertical directions. More specifically, the boundary lines between the central region 11 and the edge regions 12a to 12d may be located in the range of about ±0.55 points (55%) to ±0.7 points (70%) away from the center of the pixel array 810 in the horizontal and vertical directions.

Referring to FIG. 8E, the image sensor in accordance with an embodiment of the present invention may include a plurality of edge regions 12a1 to 12a3, 12b1 to 12b3, 12c1 to 12c3 and 12d1 to 12d3 and corner regions 13a1 to 13a9, 13b1 to 13b9, 13c1 to 13c9 and 13d1 to 13d9. Specifically, the image sensor 800 may include the pixel array 810 having regions 11, 12a1 to 12d3, and 13a1 to 13d9 which are subdivided according to the incident angles of the light leading to the changes of the light intensity transmitted to each region. The edge regions 12a1 to 12d3 may be one-dimensionally subdivided along the row direction or the column direction, and the corner regions 13a1 to 13d9 may be two-dimensionally subdivided along the row and column directions.

In addition, the pixels in the top-side edge region 12a and the bottom-side edge region 12b may the same between the amounts of light L received by their respective left photodiode LPD and right photodiode RPD on which light L is incident at the same angle θ. Thus, the volumes of the left photodiodes LPD and the right photodiodes RPD of each pixel in the top-side edge region 12a and the bottom-side edge region 12b may not be adjusted.

Furthermore, since the left photodiodes LPD and the right photodiodes RPD in the corner regions 13a to 13d are tilted at about 45° in accordance with the incident direction of the light L, if the left photodiodes LPD and the right photodiodes RPD are isolated by PD isolation regions extending in a column direction or a row direction in diagonal direction with the incident direction of the light L, the left photodiodes LPD and the right photodiodes RPD may have distorted information. Thus, the left photodiodes LPD and the right photodiodes RPD in the corner regions 13a to 13d may have information which is not distorted, only when being parallel or perpendicular to the incident direction of the light L. When the left photodiodes LPD and the right photodiodes RPD in the corner regions 13a to 13d are arranged in parallel to the incident direction of the light L, the arrangement may not be suitable for implementing an auto-focusing function. For example, when the left photodiodes LPD and the right photodiodes RPD in the corner regions 13a to 13d are arranged perpendicular to the incident direction of the light L, the arrangement may be suitable for implementing an auto-focusing function. Thus, the left photodiodes LPD and the right photodiodes RPD in the corner regions 13a to 13d in accordance with the present embodiment may be isolated by the PD isolation regions 16d1 and 16d2 extending in diagonal directions.

Figure 9:
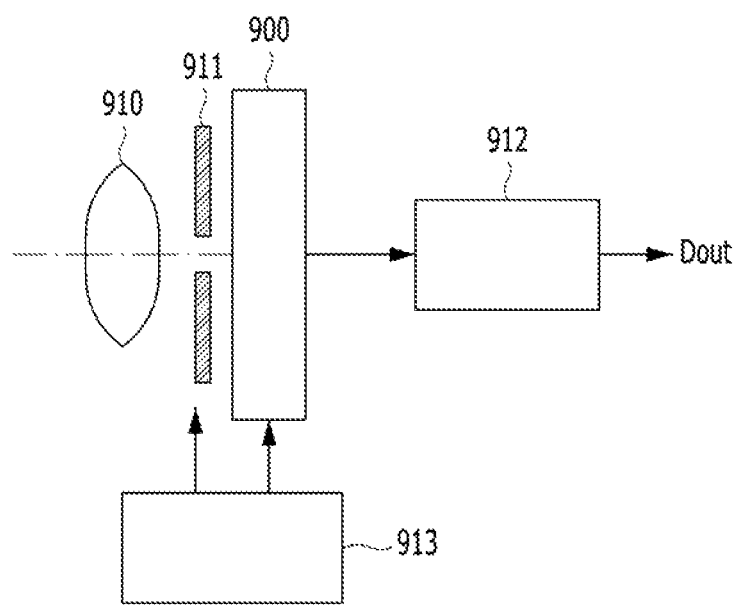
FIG. 9 is a diagram schematically illustrating an electronic device including an image sensor in accordance with various embodiments of the present invention.

Referring to FIG. 9, the electronic device having one or more of the image sensors in accordance with the various embodiments of the present invention may include a camera capable of taking a still image or moving image. The electronic device may include an optical system (optical lens) 910, a shutter unit 911, an image sensor 900, a driver 913 and a signal processor 912. The driver 913 may control/drive the shutter unit 911. The optical system 910 may guide image light (incident light) from an object to the pixel array of the image sensor 900. The optical system 910 may include a plurality of optical lenses. The shutter unit 911 may control a light irradiation period and a light shielding period for the image sensor 800. The driver 913 may control a transmission operation of the image sensor 900 and a shutter operation of the shutter unit 911. The signal processor 912 may process various types of signals outputted from the image sensor 900. The processed image signals Dout may be stored in a storage medium such as a memory, or outputted to a monitor or the like.

In accordance with the present embodiments, since the left and right photodiodes are optically and electrically isolated by the trench isolation regions, the sensitivity and the cross-talk between the photodiodes may be improved.

Furthermore, since an ion implantation process can be omitted or minimized, a thermal load on the process can be reduced. Thus, FWC (Full Well Capacitance) may be improved.

Furthermore, since the image sensor includes left and right photodiodes having different sizes (or volumes), a change in the light intensity depending on the incident angle of light can be linearly corrected.

Furthermore, since the photodiodes located in the corner regions are isolated by the PD isolation regions extended in diagonal directions, a change in the light intensity depending on the incident angle of light can be linearly corrected.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
a pixel array having a central region and peripheral regions around the central region;
one or more first unit pixels arranged in the peripheral regions, each of the first unit pixels comprising a pair of left and right photodiodes;
wherein the left and right photodiodes in at least one of the one or more of the first unit pixels have different sizes and are optically isolated from each other by a first PD isolation region.

2. The image sensor of claim 1, wherein the peripheral regions comprise a left-side edge region adjacent to a left side of the central region, and in the left-side edge region, the left photodiode has a larger size than the right photodiode.

3. The image sensor of claim 1, wherein the peripheral regions comprise a right-side edge region adjacent to a right side of the central region, and in the right-side edge region, the right photodiode has a larger size than the left photodiode.

4. The image sensor of claim 1, wherein the peripheral regions comprise a top-side edge region adjacent to a top side of the central region and a bottom-side edge region adjacent to a bottom side of the central region, and in the top-side edge region and the bottom-side edge region, the left photodiode and the right photodiode have the same size.

5. The image sensor of claim 1, wherein the peripheral regions further comprise:
corner regions arranged adjacent to corners of the central region; and
one or more second unit pixels arranged in the corner regions, each of the second unit pixels comprising a pair of first and second photodiodes which are isolated from each other by a second PD isolation region, and
wherein the second PD isolation region is extended in a diagonal direction perpendicular to a diagonal line passing through the center of the pixel array.

6. The image sensor of claim 5, wherein the first and second photodiodes in the corner regions have the same size.

7. The image sensor of claim 5, wherein the corner regions comprise a left-top corner region adjacent to the left-top corner of the central region and a right-bottom corner region adjacent to the right-bottom corner of the central region, and
one or more of the unit pixels in the left-top corner region and the right-bottom corner region comprise a left-top photodiode and a right-bottom photodiode.

8. The image sensor of claim 5, wherein the corner regions comprise a right-top corner region adjacent to the right-top corner of the central region and a left-bottom corner region adjacent to the left-bottom corner of the central region, and
one or more of the unit pixels in the right-top corner region and the left-bottom corner region comprise a left-bottom photodiode and a right-top photodiode.

9. The image sensor of claim 1, wherein the first PD isolation region comprises a DTI (Deep Trench Isolation) region.

10. The image sensor of claim 1, wherein the peripheral regions comprise edge regions and corner regions and the pixel array is divided into the central region and the edge regions in a range of 50% to 80% of the entire length from the center of the pixel array to the outermost sides of the pixel array in horizontal and vertical directions.

11. The image sensor of claim 1, further comprising grid patterns defining the first unit pixels.

12. The image sensor of claim 11, wherein parts of the grid patterns partly overlap with the left photodiodes or the right photodiodes.

13. The image sensor of claim 1, wherein the pair of the left photodiode and the right photodiode share the same color filter.

14. An image sensor comprising:
a pixel array having a central region and corner regions adjacent to corners of the central region; and
one or more first unit pixels are arranged in the corner regions, each of the first unit pixels comprising a pair of left and right photodiodes which are isolated from each other in a diagonal direction by a PD isolation region.

15. The image sensor of claim 14, wherein the corner regions comprise a left-top corner region adjacent to the left-top corner of the central region and a right-bottom corner region adjacent to the right-bottom corner of the central region, and
the PD isolation regions in the left-top corner region and the right-bottom corner region are extended in a direction from a right top to a left bottom of the pixel array.

16. The image sensor of claim 14, wherein the corner regions comprise a right-top corner region adjacent to the right-top corner of the central region and a left-bottom corner region adjacent to the left-bottom corner of the central region, and
the PD isolation regions in the right-top corner region and the left-bottom corner region are extended in a direction from a left top to a right bottom of the pixel array.

17. The image sensor of claim 14, wherein the left photodiode and the right photodiode have the same size in a triangular shape.

18. The image sensor of claim 14, wherein the pixel array further comprises a left-side edge region adjacent to a left side of the central region and a right-side edge region adjacent to a right side of the central region,
one or more second unit pixels are arranged in the left-side edge region, each of the second unit pixels comprising a left photodiode having a relatively large size and a right photodiode having a relatively small size, and one or more third unit pixels are arranged in the right-side edge region, each of the third unit pixels comprising a right photodiode having a relatively large size and a left photodiode having a relatively small size.

19. The image sensor of claim 18, wherein the pixel array further comprises a top-side edge region adjacent to a top side of the central region and a bottom-side edge region adjacent to a bottom side of the central region, and one or more fourth unit pixels are arranged in the top-side edge region and the bottom-side edge region, each of the fourth unit pixels comprising left and right photodiodes having the same size.

20. The image sensor of claim 19, wherein the left photodiodes and the right photodiodes in the left-side edge region, the right-side edge region, the top-side edge region and the bottom-side edge region are isolated by PD isolation regions extended in a column direction.

* * * * *